United States Patent
Lee et al.

(10) Patent No.: US 10,177,337 B2
(45) Date of Patent: Jan. 8, 2019

(54) LIGHTING APPARATUS USING ORGANIC LIGHT EMITTING DIODE

(71) Applicant: LG Display Co., Ltd., Seoul (KR)

(72) Inventors: Shinbok Lee, Seoul (KR); Taejoon Song, Paju-si (KR); Namkook Kim, Suwon-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/703,854

(22) Filed: Sep. 13, 2017

(65) Prior Publication Data

US 2018/0159068 A1   Jun. 7, 2018

(30) Foreign Application Priority Data

Dec. 7, 2016  (KR) .................. 10-2016-0166045

(51) Int. Cl.
*H01L 51/52* (2006.01)
*H01L 51/50* (2006.01)
*H01L 51/56* (2006.01)

(52) U.S. Cl.
CPC ...... *H01L 51/5228* (2013.01); *H01L 51/5056* (2013.01); *H01L 51/5203* (2013.01); *H01L 51/5237* (2013.01); *H01L 51/5253* (2013.01); *H01L 51/5212* (2013.01); *H01L 51/5243* (2013.01); *H01L 51/56* (2013.01); *H01L 2251/5361* (2013.01); *H01L 2251/562* (2013.01)

(58) Field of Classification Search
CPC ............. H01L 51/5228; H01L 51/5056; H01L 51/5237

See application file for complete search history.

(56) References Cited

U.S. PATENT DOCUMENTS

| 5,753,537 | A  | * | 5/1998 | Dekker ............... H01L 21/6835 257/522 |
| 2003/0122140 | A1 | * | 7/2003 | Yamazaki ......... H01L 21/67207 257/88 |
| 2012/0097987 | A1 | * | 4/2012 | Ryu .................... H01L 27/3276 257/88 |
| 2015/0255748 | A1 | * | 9/2015 | Boesch ............... H01L 51/5253 428/447 |
| 2016/0260791 | A1 | * | 9/2016 | Fleissner ............. H01L 27/3213 |
| 2016/0284806 | A1 | * | 9/2016 | Park .................. H01L 29/41791 |
| 2017/0213995 | A1 | * | 7/2017 | Wehlus ............... H01L 51/5212 |

FOREIGN PATENT DOCUMENTS

| EP | 1 914 816 A2 | 4/2008 |
| EP | 2 403 317 A1 | 1/2012 |
| JP | 2008-010211 A | 1/2008 |
| JP | 2011-009076 A | 1/2011 |
| WO | WO 2016008994 A1 * | 1/2016 ......... H01L 51/5212 |

OTHER PUBLICATIONS

Extended European Search Report dated May 11, 2018 issued in corresponding application EP 17 20 5964.4.

* cited by examiner

*Primary Examiner* — Donald Raleigh
(74) *Attorney, Agent, or Firm* — Polsinelli PC

(57) ABSTRACT

A lighting apparatus using an organic light emitting diode according to the present disclosure is configured such that a substrate is planarized by forming an anti-scratch layer on a cathode electrode to fully cover the cathode electrode.
The present disclosure having such configuration can uniformly maintain pressing pressure by virtue of the anti-scratch layer even while winding or unwinding the substrate for pulse aging, thereby preventing damages due to scratches or particles.

20 Claims, 22 Drawing Sheets

LIGHTING APPARATUS USING ORGANIC LIGHT EMITTING DIODE

CROSS-REFERENCE TO RELATED APPLICATION

Pursuant to 35 U.S.C. § 119(a), this application claims the benefit of an earlier filing date of and the right of priority to Korean Application No. 10-2016-0166045, filed on Dec. 7, 2016, the contents of which are incorporated by reference herein in its entirety.

BACKGROUND

Field of the Disclosure

The present disclosure relates to a display device, and more particularly, to a lighting apparatus, and more particularly, a lighting apparatus using an organic light emitting diode.

Background of the Disclosure

Currently, fluorescent or incandescent lamps are mainly used as lighting apparatuses. Among them, the incandescent lamps have a good color rendering index (CRI) but have low energy efficiency. The fluorescent lamps have high efficiency, but have a poor color rendering index. In addition, the fluorescent lamps contain mercury, thereby causing an environmental problem.

The CRI is an index representing color rendering. The CRI is an index indicating a degree of similarity of color tones with respect to the color of an object illuminated by a light source, when comparing a case where the object is illuminated by a specific light source with a case where the object is illuminated by a reference light source. The CRI of sunlight is 100.

In order to solve the problem of the conventional lighting apparatus, recently, a light emitting diode (LED) has been proposed as a lighting apparatus. The LED is made of an inorganic light emitting material. The LED exhibits the highest light emission efficiency in a blue wavelength band, and has light emission efficiency that is gradually lowered toward a red wavelength band and a green wavelength band. Therefore, when white light is emitted by combining a red light emitting diode, a green light emitting diode, and a blue light emitting diode, the light emission efficiency is much lowered.

As an alternative, a lighting apparatus using an organic light emitting diode (OLED) is currently developed. A general lighting apparatus using an organic light emitting diode is fabricated in a manner of forming an anode electrode made of ITO on a glass substrate, forming an organic light emitting layer and a cathode electrode on the anode electrode, and attaching a passivation layer and a lamination film thereon.

Among others, a process of depositing the organic light emitting layer and the electrode is performed under a high vacuum atmosphere, and thus deposition chambers for maintaining the high vacuum are required as many as a number of thin films to be deposited.

Further, pulse aging (hereinafter referred to as p-aging) has to be performed to prevent a defect of the organic light emitting diode provided with an organic light emitting layer and an electrode. This is to prevent such a defect by applying an aging voltage to the organic light emitting diode to oxidize the electrode. This p-aging proceeds at atmospheric pressure, i.e., air atmosphere, to oxidize the electrode. At this time, winding and unwinding of the substrate are performed to move the substrate to a p-aging chamber. During this process, an exposed surface of the organic light emitting diode may be damaged, e.g., scratched or the like. This is because the cathode electrode having a small thickness is inadequate to protect the organic light emitting layer, and there is a great risk that scratches are formed on the substrate when the substrate contacts a guide roll or when the substrate is wound. For example, if particles are present below a metal film at the time of winding the substrate or attaching the metal film by applying pressure in a vertical direction, damage is caused to the organic light emitting diode that is brought into contact with the particles due to the applied pressure.

SUMMARY OF THE DISCLOSURE

Therefore, to obviate those problems and other drawbacks, an aspect of the detailed description is to provide a lighting apparatus using an organic light emitting diode capable of preventing damages due to scratches and particles after pulse aging (p-aging).

Other aspects and features of the present disclosure will be described in the following configurations and claims of the present disclosure.

To achieve these and other advantages and in accordance with the purpose of this specification, as embodied and broadly described herein, there is provided a lighting apparatus using an organic light emitting diode, the apparatus including a substrate divided into a lighting portion, and first and second contact portions, an organic light emitting layer and a second electrode on the lighting portion of the substrate having the first passivation layer thereon, and a second passivation layer constituted to cover the organic light emitting layer and the second electrode, and planarizing a surface of the substrate.

In an aspect disclosed herein, A lighting apparatus using an organic light emitting diode, the apparatus includes a substrate having a lighting portion and first and second contact portions; an auxiliary electrode at the lighting portion on the substrate and serving as an additional contact electrode; a first electrode on the substrate including the auxiliary electrode; a passivation layer on the substrate including the first electrode; an organic emissive layer, a second electrode, and an anti-scratching layer on the entire surface of the substrate including the passivation layer; and an encapsulating layer surrounding the anti-scratching layer including on the passivation layer.

In an aspect disclosed herein, the lighting apparatus may further include a first electrode on the substrate, a first passivation layer on the first electrode, and a metal film on the lighting portion of the substrate to cover the second passivation layer.

In an aspect disclosed herein, the first and second contact portions may be located outside the lighting portion in a manner that the first contact portion is located at at least one of left and right sides of the lighting portion and the second contact portion is located at a center.

In an aspect disclosed herein, the lighting apparatus may further include a first contact electrode on the first contact portion and constituted by extending from the first electrode to the first contact portion.

In an aspect disclosed herein, the lighting apparatus may further include a second contact electrode on the lighting portion and the second contact portion and made of the same conductive material as the first electrode within the same layer as the first electrode.

In an aspect disclosed herein, the second passivation layer may include a contact hole for exposing the second contact electrode of the lighting portion therethrough.

In an aspect disclosed herein, the second electrode may be electrically connected to the second contact electrode through the contact hole.

The second passivation layer may be constituted at least up to a height of the second electrode so as to fill a periphery of the second electrode for planarizing the second electrode.

The second passivation layer may be made of an organic material of photoacryl or a gas-permeable inorganic material.

The lighting apparatus may further include a third passivation layer made of an inorganic material to cover the second passivation layer.

The first electrode including the first contact electrode may have a rectangular shape as a whole with a recess at a central portion of at least one of upper and lower portions thereof, and the second contact electrode may be disposed within the recess.

As described above, a lighting apparatus using an organic light emitting diode according to one aspect disclosed herein can uniformly maintain pressing pressure by virtue of an anti-scratch layer even while winding or unwinding the substrate for pulse aging, thereby preventing damages due to scratches or particles. Thus, a yield can be improved, resulting in reducing a fabricating cost and ensuring reliability.

Further scope of applicability of the present application will become more apparent from the detailed description given hereinafter. However, it should be understood that the detailed description and specific examples, while indicating preferred aspects of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary aspects and together with the description serve to explain the principles of the disclosure.

In the drawings.

DETAILED DESCRIPTION

Figure 1:
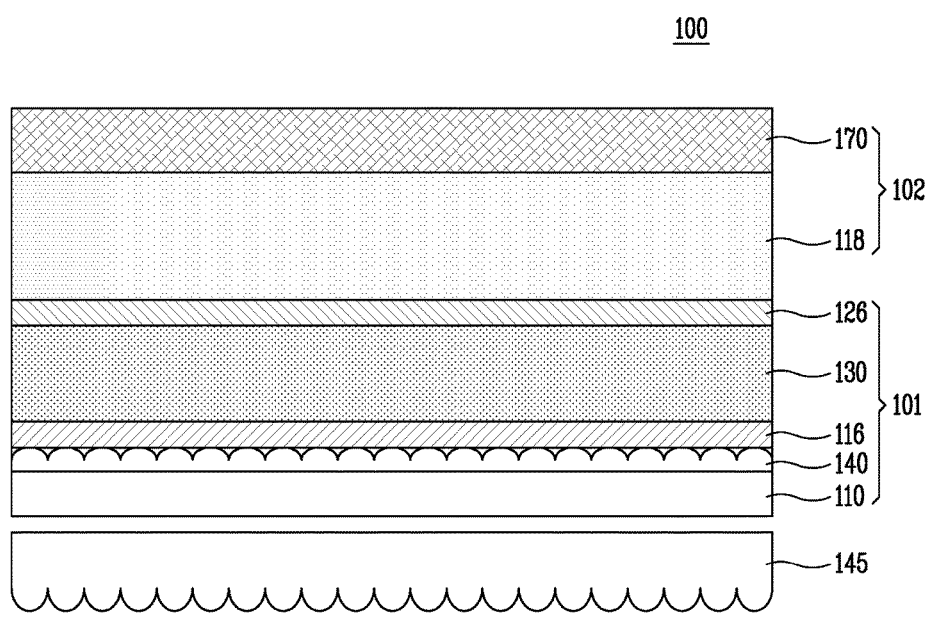
FIG. 1 is a cross-sectional view illustrating a lighting apparatus using an organic light emitting diode in accordance with an aspect of the present disclosure.

Description will now be given in detail of the aspects of a lighting apparatus using an organic light-emitting diode (OLED) according to the present disclosure, with reference to the accompanying drawings, such that those skilled in the art to which the present disclosure belongs can easily practice.

Advantages and features of the present disclosure and methods of achieving those will be obviously understood with reference to the accompanying drawings and exemplary aspects to be explained later in detail. Exemplary aspects of the inventive concepts may, however, be embodied in many different forms and should not be construed as being limited to the aspects set forth herein; rather, these aspects are provided so that this disclosure will be thorough and complete, and will fully convey the concept of example aspects to those of ordinary skill in the art. The same/like reference symbols refer to the same/like components throughout the specification. In the drawings, the thicknesses of layers and regions are exaggerated for clarity.

It will be understood that when an element is referred to as being "on" another element, the element can be located on the other element or intervening elements may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below.

The terminology used herein is for the purpose of describing particular aspects only and is not intended to be limiting of example aspects. As used herein, the singular forms are intended to include the plural forms as well, unless the context clearly indicates otherwise. It will be further understood that the terms "comprises", "comprising", "includes" and/or "including," if used herein, specify the presence of stated steps, operations, elements and/or components, but do not preclude the presence or addition of one or more other features, integers, steps, operations, elements, components and/or groups thereof.

FIG. 1 is a cross-sectional view illustrating a lighting apparatus using an organic light emitting diode in accordance with an aspect of the present disclosure.

Figure 2:
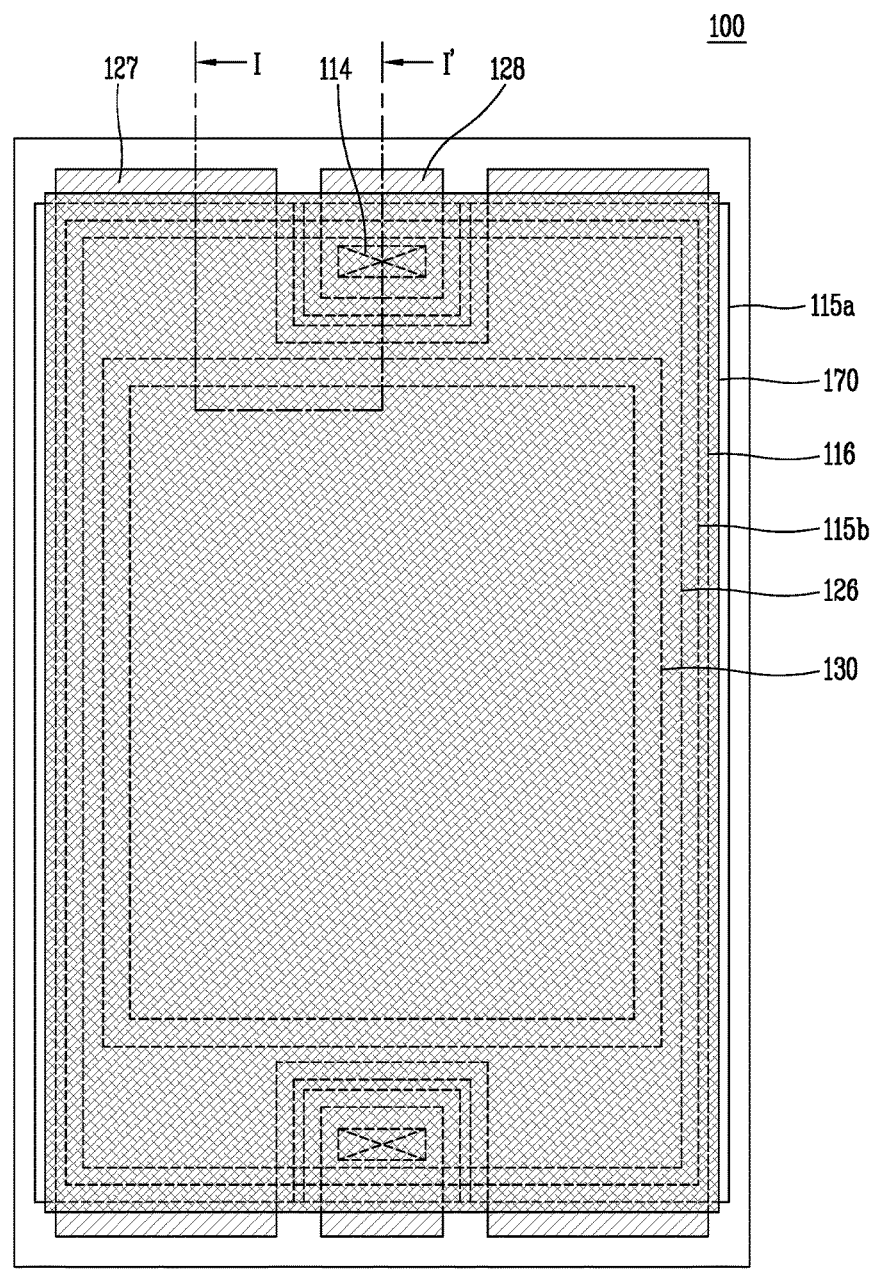
FIG. 2 is a planar view schematically illustrating the lighting apparatus using the organic light emitting diode in accordance with the aspect of the present disclosure.

FIG. 2 is a planar view schematically illustrating the lighting apparatus using the organic light emitting diode in accordance with the aspect of the present disclosure.

Figure 3:
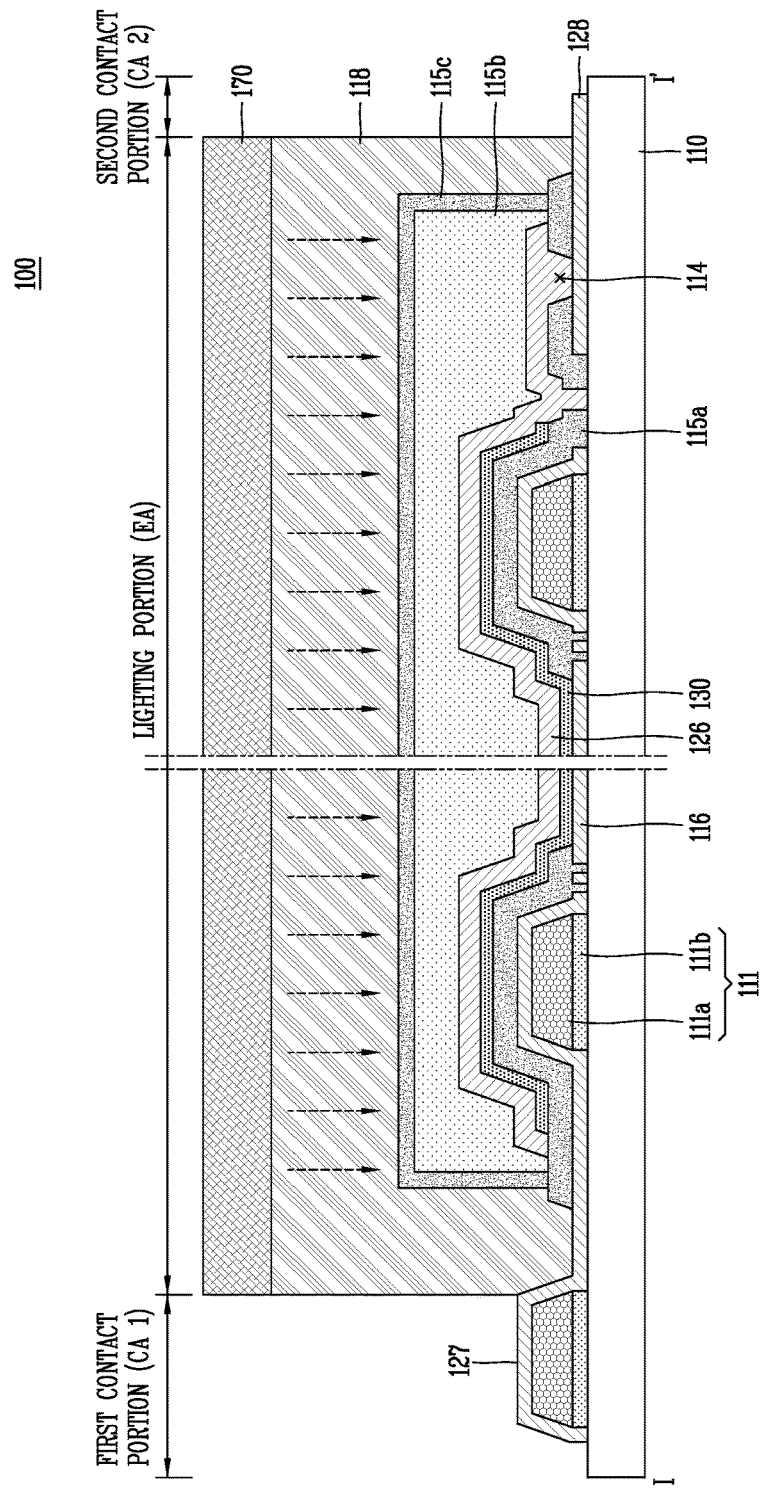
FIG. 3 is a schematic view illustrating a cross-section of the lighting apparatus using the organic light emitting diode, taken along line I-I' of FIG. 2.

As illustrated in FIGS. 1 to 3, a lighting apparatus 100 using an organic light emitting diode according to an aspect of the present disclosure may include an organic light emitting diode part 101 performing a surface emission, and an encapsulating part 102 encapsulating the organic light emitting diode part 101.

At this time, the lighting apparatus 100 may further include an external light extracting layer 145 provided beneath the organic light emitting diode part 101 to increase haze.

The external light extracting layer 145 may be formed by dispersing scattering particles, such as $TiO_2$, in resin and attached to a lower portion of a substrate 110 using an adhesive layer (not illustrated).

The organic light emitting diode part 101 may be configured as an organic light emitting diode disposed on the substrate 110, and in this instance, an internal light extracting layer 140 may be further provided between the substrate 110 and the organic light emitting diode.

A planarizing layer (not illustrated) may further be provided on the internal light extracting layer 140.

In this instance, the substrate 110 may include a lighting portion EA that actually emits light to the outside, and contact portions CA1 and CA2 that are electrically connected to the outside through contact electrodes (pad electrodes) 127 and 128 to apply a signal to the lighting portion EA.

The contact portions CA1 and CA2 are not covered by an encapsulating member of a metal film 170 and thus may be electrically connected to the outside through the contact electrodes 127 and 128. Therefore, a metal film 170 may be attached on the entire surface of the lighting portion EA of the substrate 110 except for the contact portions CA1 and CA2.

At this time, the contact portions CA1 and CA2 are located outside the lighting portion EA. FIG. 2 illustrates that the second contact portion CA2 is located between the first contact portions CA1, but the present disclosure is not limited to this.

Also, FIG. 2 illustrates that the contact portions CA1 and CA2 are all located on upper and lower sides of the lighting portion EA at the outside of the lighting portion EA. However, the present disclosure is not limited thereto. Therefore, the contact portions CA1 and CA2 of the present disclosure may be located at the outside of only one of the upper and lower sides of the lighting portion EA.

A first electrode 116 and a second electrode 126 may be disposed on the substrate 110 and an organic light emitting layer 130 is interposed between the first electrode 116 and the second electrode 126, thereby implementing an organic light emitting diode. In the lighting apparatus 100 having such a structure, as a signal is applied to the first electrode 116 and the second electrode 126 of the organic light emitting diode, the organic light emitting layer 130 emits light to be output through the lighting portion EA.

The organic light emitting layer 130 may be a light emitting layer that outputs white light. For example, the organic light emitting layer 130 may also include a blue light emitting layer, a red light emitting layer, a green light emitting layer, or may have a tandem structure including a blue light emitting layer and a yellow-green light emitting layer. However, the organic light emitting layer 130 of the present disclosure is not limited to the above-described structure, and may employ various structures.

The organic light emitting layer 130 according to the present disclosure may further include an electron injection layer and a hole injection layer for injecting electrons and holes, respectively, into the light emitting layer, an electron transport layer and a hole transport layer for transporting the injected electrons and holes to the light emitting layer, and a charge generation layer for generating charges, such as the electrons and holes.

At this time, since the first passivation layer 115a, the organic light emitting layer 130 and the second electrode 126 are not formed on the contact portions CA1 and CA2 outside the lighting portion EA, the contact electrodes 127 and 128 may be exposed to outside. At this time, the second passivation layer 115b, which is an anti-scratch layer, and the third passivation layer 115c, which is an encapsulating layer, are formed to cover the organic light emitting layer 130 and the second electrode 126 of the lighting portion EA, such that moisture can be prevented from being introduced into the organic light emitting layer 130 of the lighting portion EA.

Generally, when a polymer constituting an organic light emitting material is combined with moisture, a light emission property is drastically deteriorated, thereby lowering the light emission efficiency of the organic light emitting layer 130. Specifically, when a part of the organic light emitting layer 130 is externally exposed in the lighting apparatus 100, moisture is propagated into the lighting apparatus 100 along the organic light emitting layer 130 so as to lower the light emission efficiency of the lighting apparatus 100. Accordingly, in the present disclosure, the second passivation layer 115b and the third passivation layer 115c cover the organic light emitting layer 130 and the second electrode 126 of the lighting portion EA so as to prevent moisture from being introduced into the organic light emitting layer 130 of the lighting portion EA of the lighting apparatus 100, from which light is actually emitted. Also, since the second passivation layer 115b planarizes a protruding portion of the auxiliary electrode 111, pressure applied to the substrate 110 may uniformly be maintained even when winding or unwinding the substrate 110 for pulse aging (p-aging), thereby preventing damages due to scratches and particles. Therefore, yield can be improved, resulting in reducing a fabricating cost and ensuring reliability.

At this time, the second passivation layer 115b may be made of an organic material or a gas-permeable inorganic material. The second passivation layer 115b may be formed to have a thickness of about 5 to 10 μm through a deposition or coating process such as flash evaporation.

The third passivation layer 115c may be made of an inorganic material.

At this time, the first electrode 116 including the first contact electrode 127 and the second contact electrode 128 are disposed on the substrate 110 made of a transparent material. A rigid material such as glass may be used as the substrate 110. However, the substrate 110 may be made of a material having flexibility such as plastic, which may allow a fabrication of the lighting apparatus 100 which is bendable or curvable. Further, in the present disclosure, by using a plastic material having flexibility for fabricating the substrate 110, a process using a roll may be enabled, which may result in a fast fabrication of the lighting apparatus 100.

The first electrode 116 including the first contact electrode 127 and the second contact electrode 128 are formed on the lighting portion EA and the first and second contact portions CA1 and CA2, and may be made of a transparent conductive material having good electrical conductivity and a high work function. For example, in the present disclosure, the first electrode 116 including the first contact electrode 127 and the second contact electrode 128 may be made of a tin oxide-based conductive material such as indium tin oxide (ITO) or a zinc oxide-based conductive material of indium zinc oxide (IZO). A transparent conductive polymer may also be used.

The first electrode 116 extends to the first contact portion CA1 outside the lighting portion EA to become the first contact electrode 127, and the second contact electrode 128 electrically insulated from the first electrode 116 may be disposed on a part of the lighting portion EA and the second contact portion CA2. In other words, the second contact electrode 128 may be disposed in the same layer as the first electrode 116, in a state of being electrically insulated from the first electrode 116.

For example, FIG. 2 illustrates that the first electrode 116 including the first contact electrode 127 is formed in a rectangular shape as a whole with recessed upper and lower central portions, and the second contact electrode 128 is disposed at each recess. However, the present disclosure is not limited thereto.

The auxiliary electrode 111 may be disposed on the lighting portion EA and the first contact portion CA1 of the substrate 110 to be electrically connected to the first electrode 116 and the first contact electrode 127. The first electrode 116 is made of a transparent conductive material so as to well transmit the emitted light, but causes extremely higher electric resistance than an opaque metal. Therefore, when the large lighting apparatus 100 is fabricated, currents applied to a wide light emitting area are unevenly distributed due to the high resistance of the transparent conductive material, and the uneven current distribution prevents the large lighting apparatus 100 from emitting light with uniform luminance.

The auxiliary electrode 111 is arranged in a form of a thin matrix, a mesh, a hexagon, an octagon, a circle, or the like throughout the entire lighting portion EA. This allows the current to be evenly applied to the first electrode 116 of the entire lighting portion EA, thereby enabling the lighting apparatus 100 to emit light with uniform luminance.

FIG. 3 illustrates that the auxiliary electrode 111 is disposed on a lower portion of the first electrode 116 including the first contact electrode 127. However, the present disclosure is not limited thereto, and the auxiliary electrode 111 may alternatively be disposed on an upper portion of the first electrode 116 including the first contact electrode 127. The auxiliary electrode 111 disposed on the first contact portion CA1 is used as a path for transferring the current toward the first electrode 116 through the first contact electrode 127. However, the auxiliary electrode 111 may also serve as a contact electrode which is brought into contact with the outside to apply an external current to the first electrode 116.

The auxiliary electrode 111 may be made of a metal having good electrical conductivity such as Al, Au, Cu, Ti, W, Mo, or an alloy thereof. The auxiliary electrode 111 may have a two-layered structure including an upper auxiliary electrode 111a and a lower auxiliary electrode 111b. However, the present disclosure is not limited thereto and the auxiliary electrode 111 may be configured as a single layer.

The first passivation layer 115a may be laminated on the lighting portion EA of the substrate 110. FIG. 2 illustrates that the first passivation layer 115a is shown having a shape of a rectangular frame with a predetermined width, but the present disclosure is not limited thereto.

The first passivation layer 115a disposed in the lighting portion EA is to cover the auxiliary electrode 111 and the first electrode 116 on the auxiliary electrode 111. In the light emitting area where light is actually emitted, the first passivation layer 115a is not disposed. In particular, the first passivation layer 115a of the lighting portion EA is formed to surround the auxiliary electrode 111 to reduce a stepped portion (or step coverage) caused by the auxiliary electrode 111. Accordingly, various layers to be formed later can be stably formed without being disconnected.

The first passivation layer 115a may be made of an inorganic material such as $SiO_x$ or $SiN_x$. However, the first passivation layer 115a may be made of an organic material such as photoacryl, or may be formed by a plurality of layers of an inorganic material and an organic material.

The organic light emitting layer 130 and the second electrode 126 may be disposed on the substrate 110 on which the first electrode 116 and the first passivation layer 115a are disposed. At this time, the first passivation layer 115a on the second contact electrode 128 located in the lighting portion EA may have a predetermined area, which is removed to form a contact hole 114 for exposing a port of the second contact electrode 128. Accordingly, the second electrode 126 may be electrically connected to the lower second contact electrode 128 through the contact hole 114.

The organic light emitting layer 130, which is a white organic light emitting layer, may include a red light emitting layer, a blue light emitting layer, and a green light emitting layer, or have a tandem structure including a blue light emitting layer and a yellow-green light emitting layer. The organic light emitting layer 130 may include an electron injection layer and a hole injection layer for injecting electrons and holes respectively into the light emitting layer, an electron transport layer and a hole transport layer for transporting the injected electrons and holes to the light emitting layer, and a charge generation layer for generating charges such as the electrons and the holes.

The second electrode 126 may be made of a metal such as Al, Mo, Cu or Ag, or an alloy such as MoTi.

The first electrode 116, the organic light emitting layer 130, and the second electrode 126 of the lighting portion EA constitute an organic light emitting diode. In this instance, the first electrode 116 is an anode of the organic light emitting diode and the second electrode 126 is a cathode. When currents are applied to the first electrode 116 and the second electrode 126, electrons are injected from the second electrode 126 into the organic light emitting layer 130 and holes are injected from the first electrode 116 into the organic light emitting layer 130. Afterwards, excitons are generated in the organic light emitting layer 130. As the excitons are decayed, light corresponding to an energy difference between Lowest Unoccupied Molecular Orbital (LUMO) and Highest Occupied Molecular Orbital (HOMO) of the light emitting layer is generated and emitted downward (toward the substrate 110 in the drawing).

At this time, since the first passivation layer 115a is disposed on the auxiliary electrode 111 of the lighting portion EA, the organic light emitting layer 130 on the auxiliary electrode 111 is not directly brought into contact with the first electrode 116, and thus the organic light emitting diode is not formed on the auxiliary electrode 111. That is, the organic light emitting diode within the lighting portion EA, for example, is formed only within the light emitting area in the auxiliary electrode 111 formed in a matrix configuration.

The second passivation layer 115b and the third passivation layer 115c may be provided on the entire surface of the substrate 110 on which the second electrode 126 is formed.

The second passivation layer 115b according to this aspect of the present disclosure, as described above, is formed to cover the organic light emitting layer 130 and the second electrode 126 of the lighting portion EA. Accordingly, the second passivation layer 115b can prevent moisture introduction into the organic light emitting layer 130 of the lighting portion EA and simultaneously serve as an anti-scratch layer for preventing damages due to scratches or particles.

That is, in the present disclosure, the second passivation layer 115b and the third passivation layer 115c, in addition to the adhesive 118 and the encapsulating member of the metal film 170, are formed to cover the organic light emitting layer 130 and the second electrode 126 of the lighting portion EA, thereby preventing the moisture introduction into the organic light emitting layer 130 of the lighting portion EA of the lighting apparatus 100, from which light is actually emitted.

The second passivation layer 115b is formed to have a thickness of about 5 to 10 μm and planarizes the protruding portion of the auxiliary electrode 111. Therefore, pressure applied to the substrate 110 (as indicated with arrows in FIG. 3) may uniformly be maintained even when winding or unwinding the substrate 110 for p-aging, thereby preventing damages due to scratches or particles. That is, a surface of the substrate 110 after the formation of the second electrode 126 is vulnerable to damages by scratches or particles. Also, a movement between chambers is required for the p-aging, which is a subsequent process. Accordingly, winding, a movement, and unwinding of the substrate 110 are executed. At this time, pressing pressure is concentrated on the protruding portion of the auxiliary electrode 111, and not only the surface of the second electrode 126 but also the organic light emitting layer 130 are damaged by the scratches or particles, which causes a defect. Accordingly, in order to prevent the second electrode 126 and the organic light emitting layer 130 from being damaged due to the scratches or particles and also prevent damages on lower layers when pressure is applied from an upper portion of the second electrode 126, the second passivation layer 115b having a sufficient thickness is formed on the upper portion of the second electrode 126. The second passivation layer 115b which is formed to have a thickness of about 5 to 10 μm may planarize the protruding portion of the auxiliary electrode 111 and simultaneously bury the particles while preventing the scratch from going deeply down to the second electrode 126. Therefore, the second passivation layer 115b fills a periphery of the second electrode 126, and is formed at least up to a height of the second electrode 126.

At this time, the second passivation layer 115b may be made of an organic material such as photoacryl or a gas-permeable inorganic material. In addition, the third passivation layer 115c may be made of an inorganic material such as $SiO_x$ or $SiN_x$. However, the present disclosure is not limited thereto.

A predetermined encapsulant may be additionally provided on the third passivation layer 115c. The encapsulant may be an epoxy compound, an acrylate compound, an acrylic compound, or the like.

As described above, the first contact electrode 127 extending from the first electrode 116 is exposed to the outside on the first contact portion CA1 of the substrate 110. The second contact electrode 128 electrically connected to the second electrode 126 is exposed to the outside through the contact hole 114 on the second contact portion CA2 of the substrate 110. Accordingly, the first contact electrode 127 and the second contact electrode 128 are electrically connected to an external power source so as to apply currents to the first electrode 116 and the second electrode 126, respectively.

An adhesive 118 such as Pressure Sensitive Adhesive (PSA) is coated on the third passivation layer 115c and a metal film 170 is disposed on the third passivation layer 115c. Accordingly, the metal film 170 is adhered to the third passivation layer 115c, thereby encapsulating the lighting apparatus 100.

At this time, the adhesive 118 and the encapsulating means of the metal film 170 sufficiently cover the second passivation layer 115b and the third passivation layer 115c.

The adhesive 118 may be a photocurable adhesive or a thermosetting adhesive.

As described above, in the present disclosure, the substrate 110 made of the flexible plastic film can be used, and simultaneously the damages on the organic light emitting layer 130 due to scratches or particles can be prevented even when winding or unwinding the substrate 110. This may facilitate a fabrication of the lighting apparatus using a roll, which may result in a fast fabrication of the lighting apparatus 100 and a reduction of a fabrication cost.

Hereinafter, a method of fabricating a lighting apparatus using an organic light emitting diode according to an aspect of the present disclosure will be described in detail with reference to the drawings.

FIGS. 4A to 4G are planar views sequentially illustrating a method of fabricating the lighting apparatus using the organic light emitting diode according to the aspect of the present disclosure illustrated in FIG. 2.

Figure 4A:
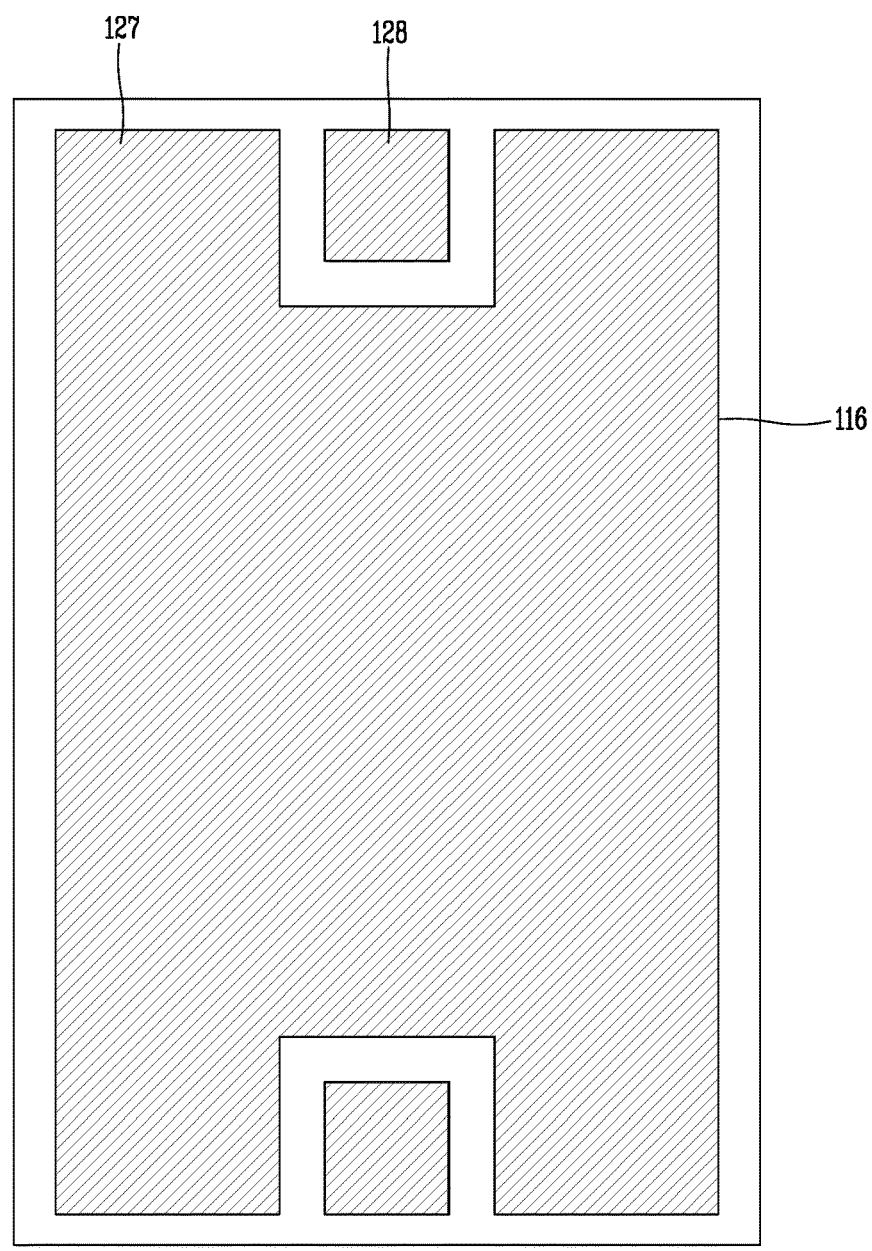
FIGS. 4A to 4G are planar views sequentially illustrating a method of fabricating the lighting apparatus using the organic light emitting diode illustrated in FIG. 2.
Figure 4B:
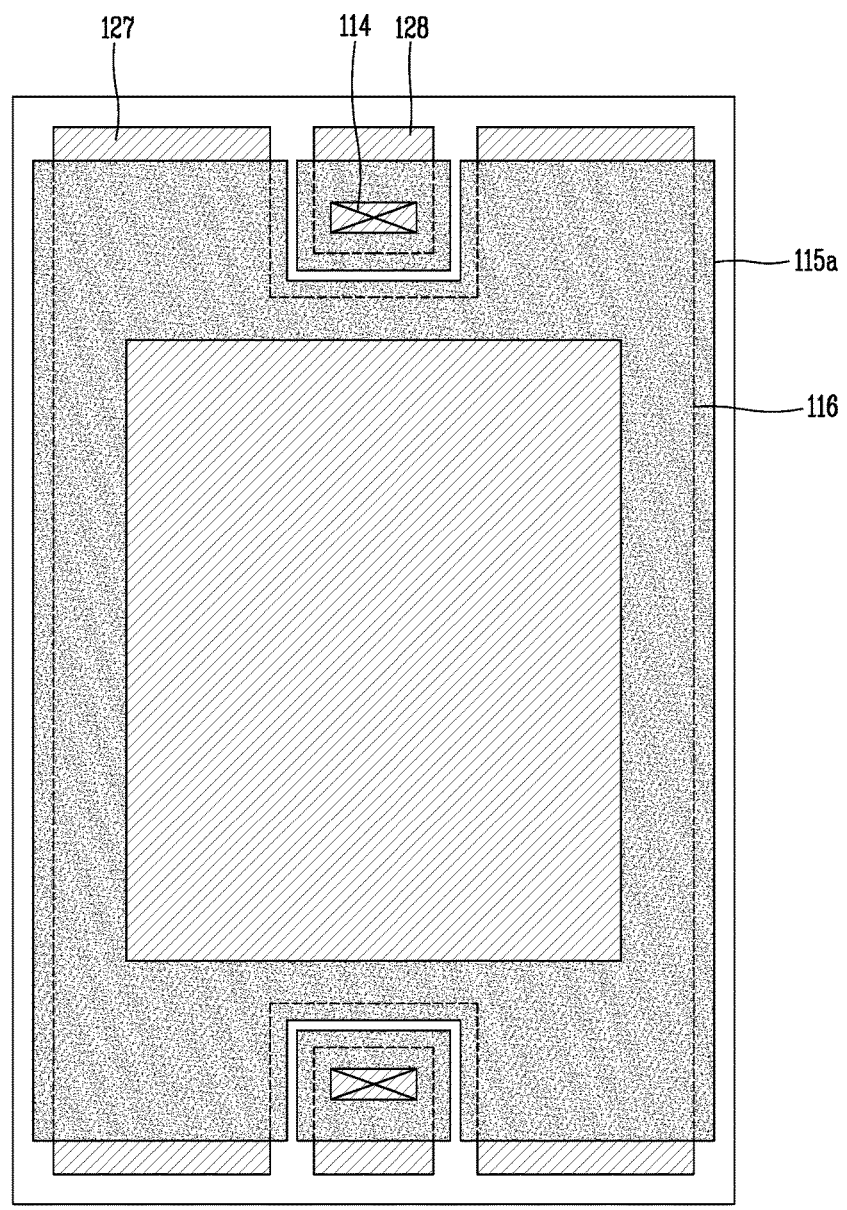
Figure 5:
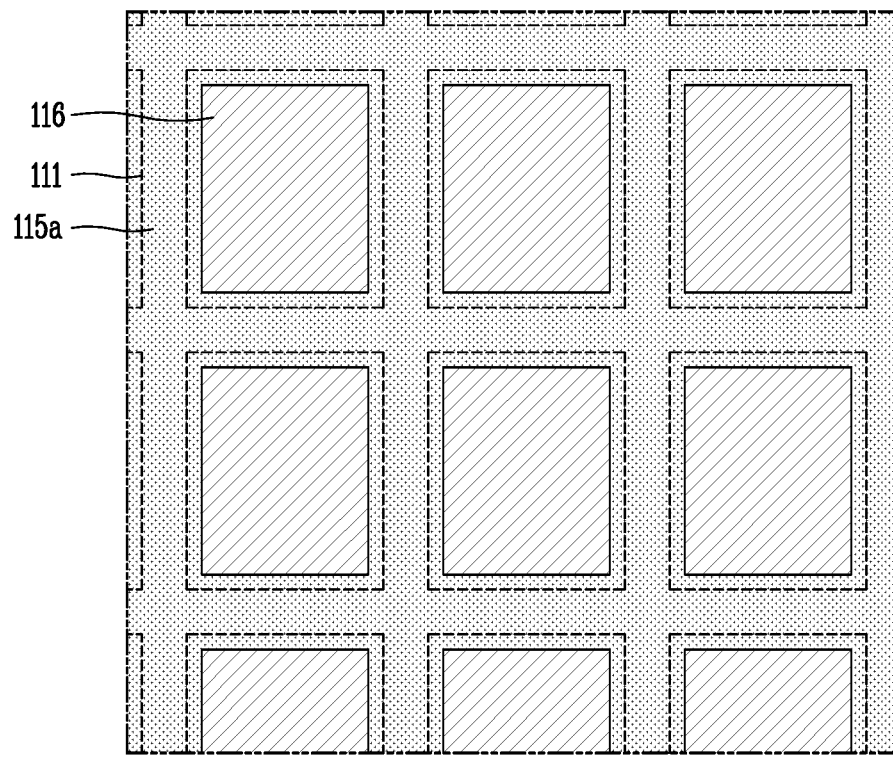
FIG. 5 is an enlarged view of a part of the lighting portion illustrated in FIG. 4B.

FIG. 5 is an enlarged view of a part of the lighting portion illustrated in FIG. 4B.

FIGS. 6A to 6G are cross-sectional views sequentially illustrating a method of fabricating the lighting apparatus using the organic light emitting diode according to the aspect of the present disclosure illustrated in FIG. 3.

Figure 7:
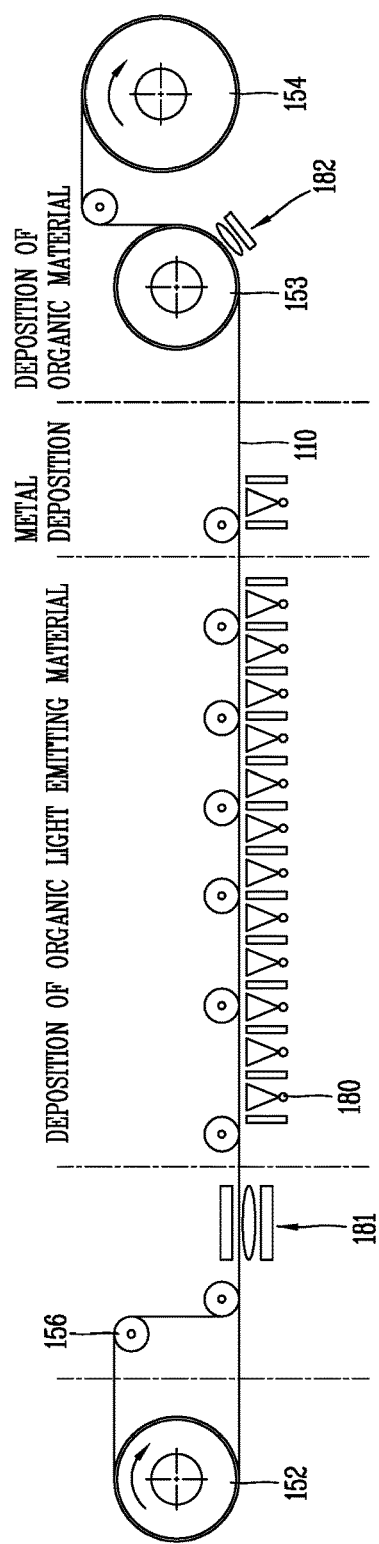
FIGS. 7 to 9 are cross-sectional views illustrating a part of a roll-to roll device of a lighting apparatus using an organic light emitting diode in accordance with an aspect of the present disclosure.
Figure 8:
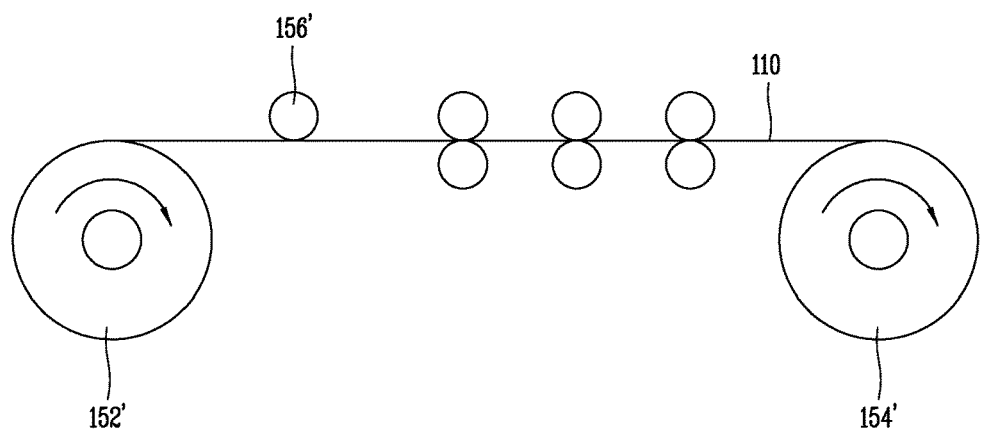
Figure 9:
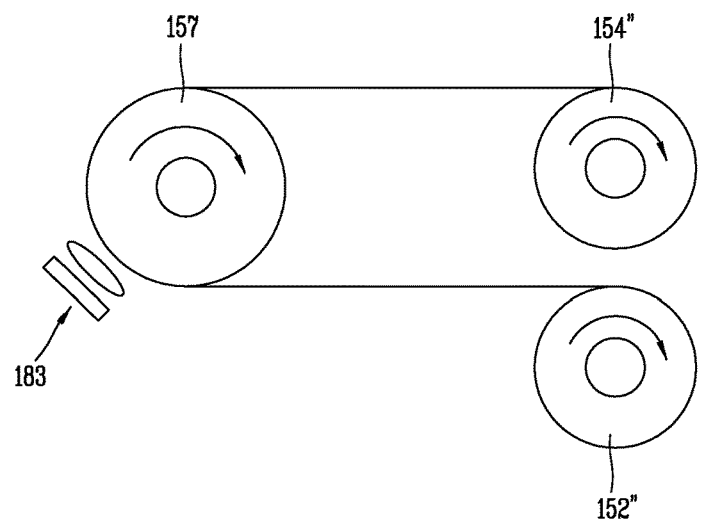

FIGS. 7 to 9 are cross-sectional views illustrating a part of a roll-to-roll apparatus for fabricating the lighting apparatus using the organic light emitting diode according to the aspect of the present disclosure. In this instance, FIG. 7 illustrates a roll-to-roll apparatus for a deposition of an organic light emitting material for an organic light emitting layer, a metal deposition for a second electrode, and a deposition of an organic material for a second passivation layer. FIG. 8 illustrates a roll-to-roll apparatus for a p-aging process, and FIG. 9 illustrates a roll-to-roll apparatus for a deposition of an inorganic material for a third passivation layer.

At this time, although the illustrated fabricating method relates to the process performed in the roll-to-roll apparatus, the present disclosure is not limited thereto, and may be similarly applied even to a general fabricating apparatus using a substrate such as glass.

Figure 6A:
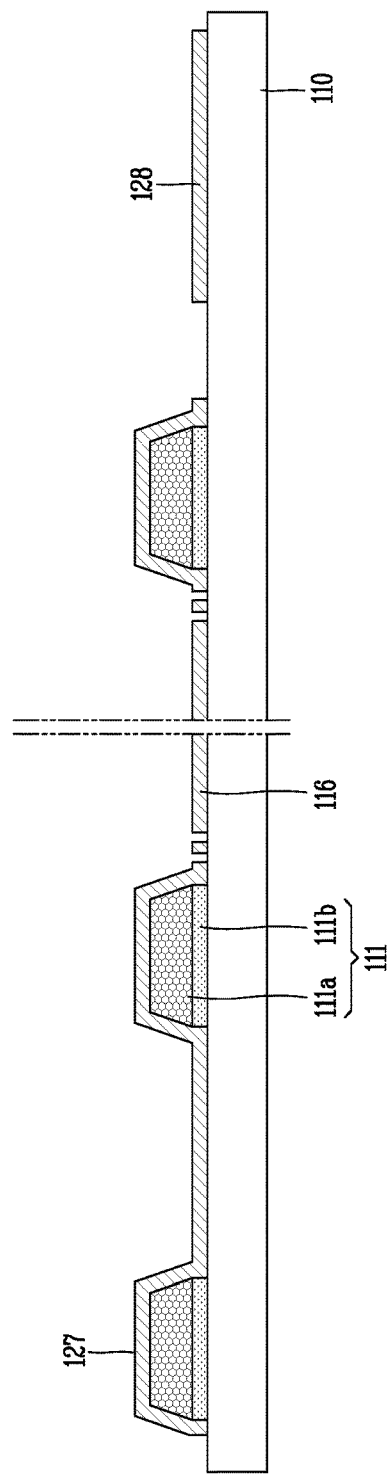
FIGS. 6A to 6G are cross-sectional views sequentially illustrating a method of fabricating the lighting apparatus using the organic light emitting diode illustrated in FIG. 3.

First, as illustrated in FIGS. 4A and 6A, a metal such as Al, Au, Cu, Ti, W, Mo, or an alloy thereof is deposited on the substrate 110 divided into the lighting portion and the contact portions, and then etched, thereby forming the auxiliary electrode 111, which is configured as a single layer or a plurality of layers, on the lighting portion and the first contact portion.

In this instance, FIGS. 4A and 6A illustrate an example in which the auxiliary electrode 111 is formed in a two-layered structure including an upper auxiliary electrode 111a and a lower auxiliary electrode 111b. However, as aforementioned, the present disclosure is not limited thereto.

At this time, the auxiliary electrode 111 may be arranged in a thin matrix shape (as shown in FIG. 5), a mesh shape, a hexagonal shape, an octagonal shape, or a circular shape throughout the entire lighting portion EA.

Afterwards, a transparent conductive material such as ITO or IZO is deposited on the entire surface of the substrate 110 and etched to form the first electrode 116 including the first contact electrode 127 and the second contact electrode 128 on the lighting portion and the first and second contact portions.

In this case, the first electrode 116 may extend to the first contact portion outside the lighting portion to constitute the first contact electrode 127, and the second contact electrode 128 electrically insulated from the first electrode 116 may be formed on a part of the lighting portion and the second contact portion. That is, the second contact electrode 128 is formed within the same layer as the first electrode 116, with being electrically insulated from the first electrode 116.

For example, FIG. 4A illustrates that the first electrode 116 including the first contact electrode 127 is formed in a rectangular shape as a whole, with upper and lower central portions recessed, and the second contact electrode 128 is formed in each recess. However, the present disclosure is not limited thereto.

In this instance, FIGS. 4A and 6A illustrate that the auxiliary electrode 111 is formed on a lower portion of the first electrode 116 including the first contact electrode 127. However, the present disclosure is not limited thereto. The auxiliary electrode 111 may alternatively be formed on an upper portion of the first electrode 116 including the first contact electrode 127. The auxiliary electrode 111 disposed on the first contact portion may be used as a path for transferring current to the first electrode 116, but also serve as a contact electrode which is brought into contact with an outside for applying external current to the first electrode 116.

Figure 6B:
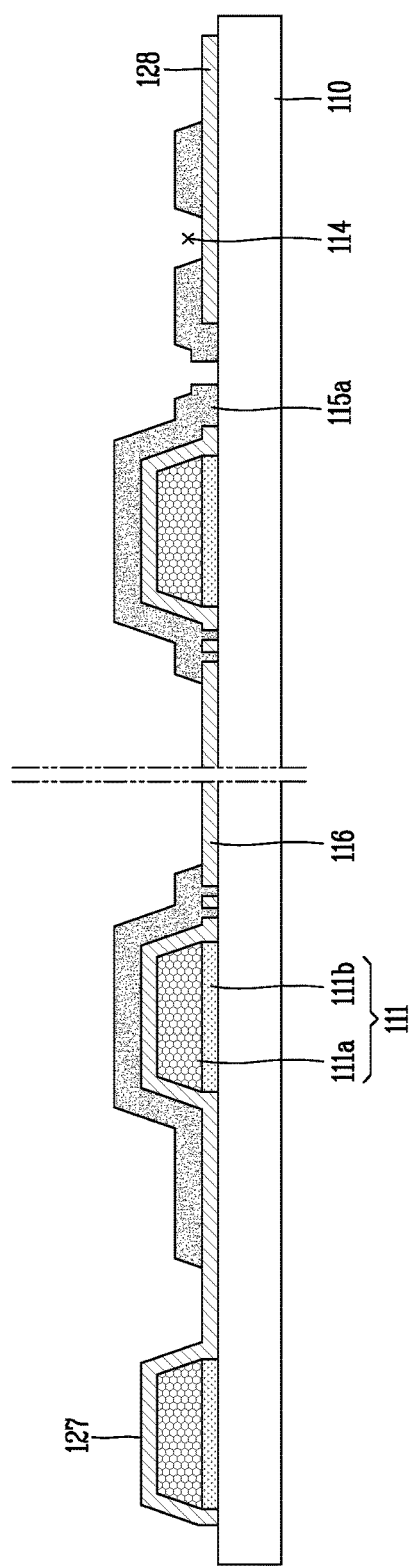

Afterwards, as illustrated in FIGS. 4B and 6B, an inorganic material such as $SiN_x$ or $SiO_x$ or an organic material such as photoacryl is laminated on a part of the lighting portion of the substrate 110. The inorganic material or the organic material is then etched to form the first passivation layer 115a on the upper and side portions of the auxiliary electrode 111 of the lighting portion, and simultaneously form the contact hole 114 for exposing a part of the second contact electrode 128.

At this time, the first passivation layer 115a is formed to cover the auxiliary electrode 111 and the first electrode 116 on the auxiliary electrode 111, but is not formed on the light emitting area from which light is actually emitted (However, referring to FIG. 5, the first passivation layer 115a may actually be formed in a matrix shape within the light emitting area to cover the auxiliary electrode 111 arranged in the matrix shape). In particular, the first passivation layer 115a is formed to surround the auxiliary electrode 111 to reduce the stepped portion (or step coverage) caused by the auxiliary electrode 111, so that various layers to be formed later can be stably formed without being disconnected.

FIG. 4B illustrates that the first passivation layer 115a is shown having a shape of a rectangular frame with a predetermined width, but the present disclosure is not limited thereto. Also, FIG. 4B illustrates an example in which the first passivation layer 115a on the first electrode 116 is separated (isolated) from the first passivation layer 115a on the second contact electrode 128. However, the present disclosure is not limited thereto.

Referring to FIGS. 4C to 4E and 6C to 6E, the organic light emitting layer 130, the second electrode 126 and the second passivation layer 115b, which are made of an organic light emitting material, a metal and an organic insulating material, respectively, are formed within the lighting portion of the substrate 110.

Figure 4C:
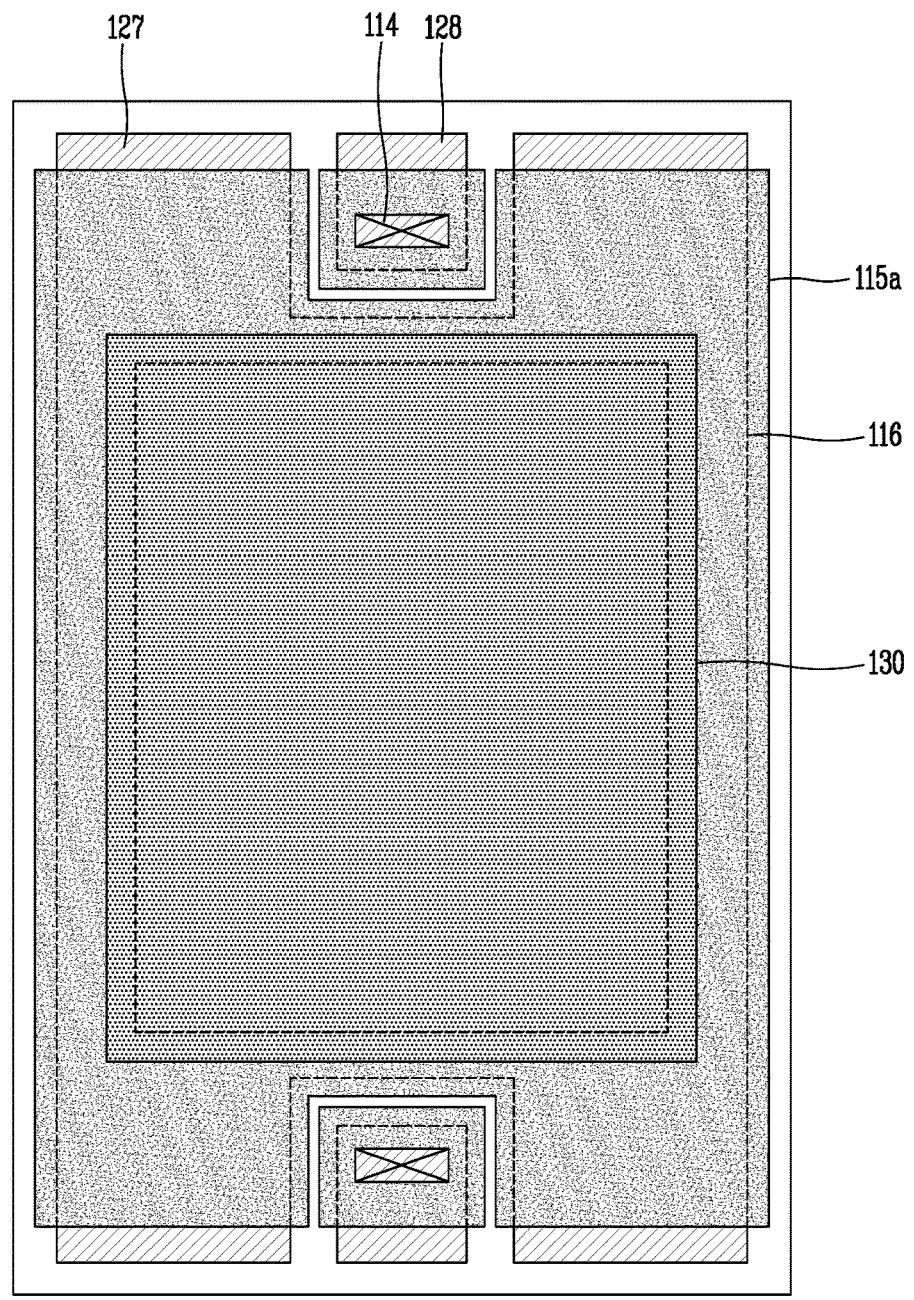
Figure 6C:
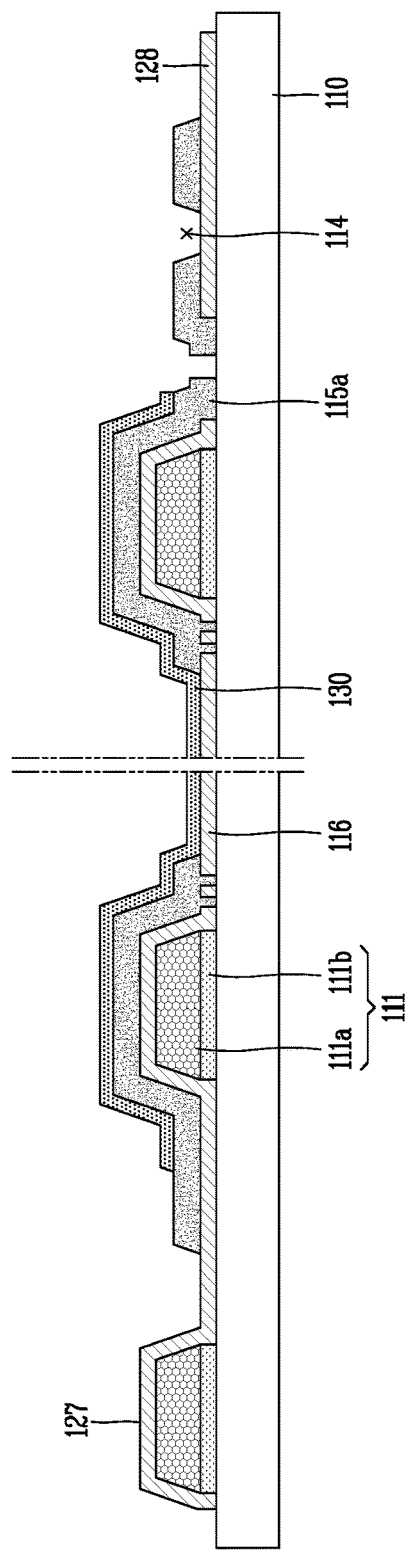

First, referring to FIGS. 4C and 6C, the organic light emitting layer 130 made of the organic light emitting material is formed within the lighting portion of the substrate 110.

In this instance, the organic light emitting layer 130 which is a white light organic light emitting layer may include a red light emitting layer, a blue light emitting layer, a green light emitting layer, or may have a tandem structure including a blue light emitting layer and a yellow-green light emitting layer. Also, the organic light emitting layer 130 may include an electron injection layer and a hole injection layer for injecting electrons and holes respectively into the light emitting layer, an electron transport layer and a hole transport layer for transporting the injected electrons and holes to the light emitting layer, and a charge generating layer for generating charges such as the electrons and holes.

Figure 4D:
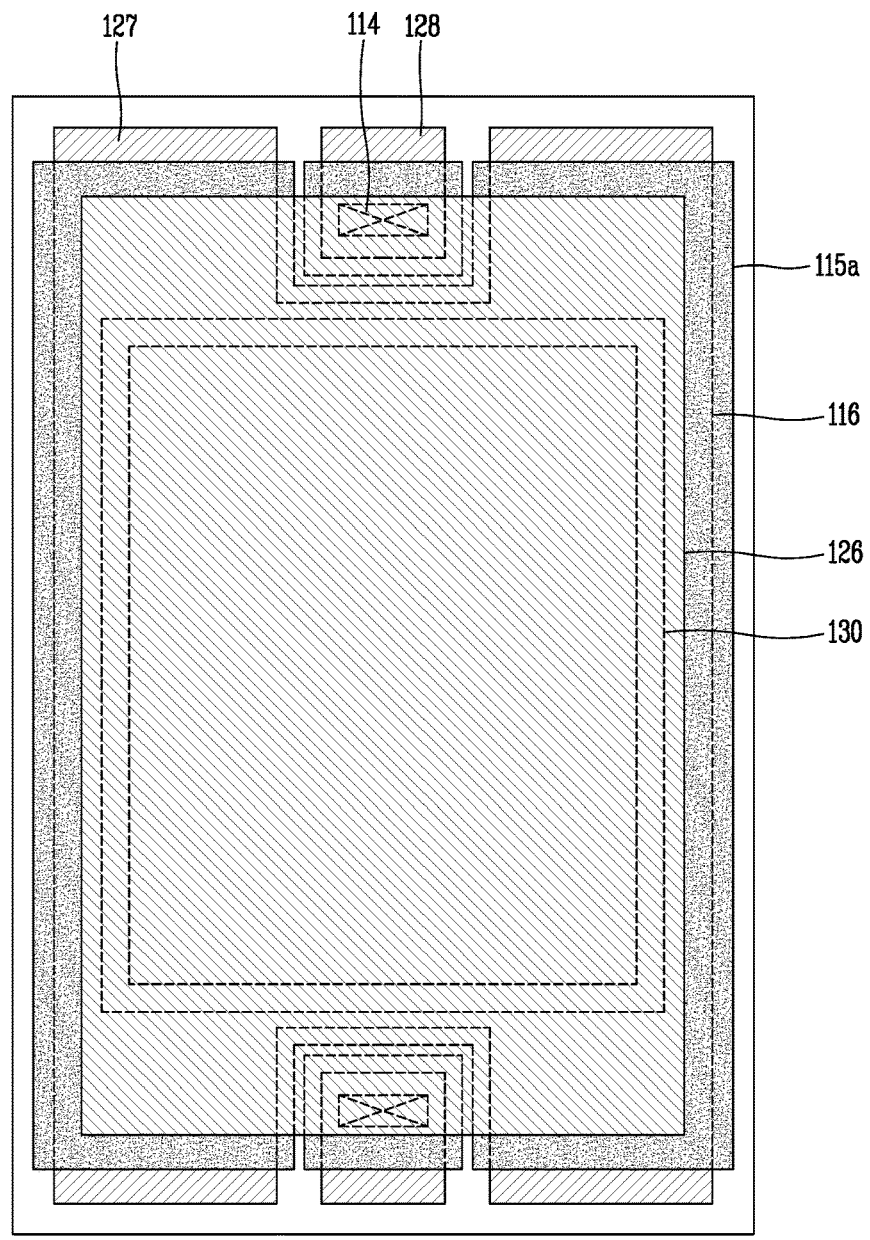
Figure 6D:
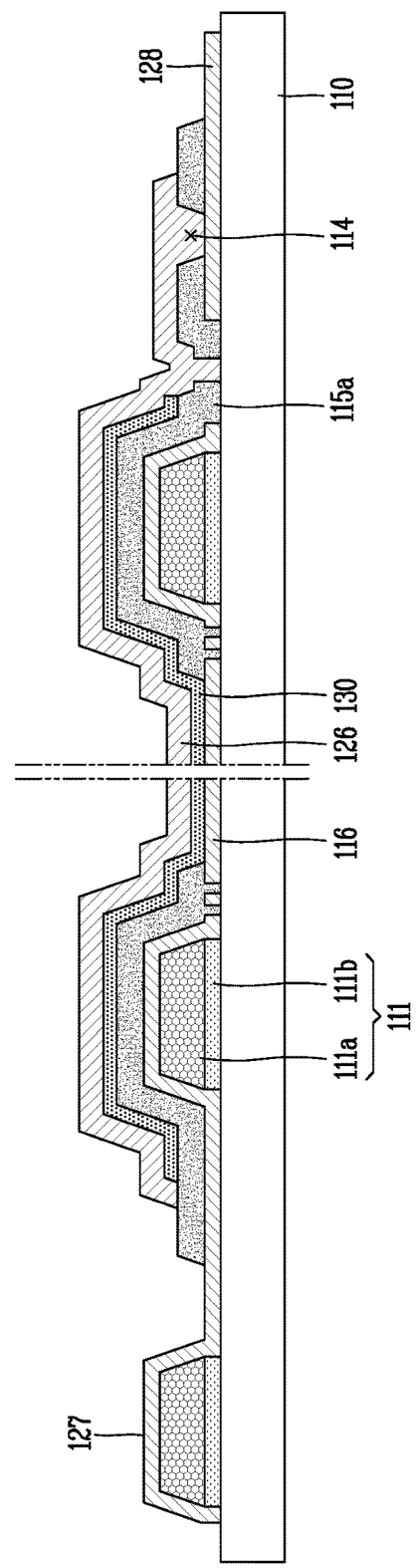

Next, referring to FIGS. 4D and 6D, the second electrode 126 made of the metal is formed within the lighting portion of the substrate 110 in a manner of covering the organic light emitting layer 130.

At this time, the second electrode 126 may be electrically connected to the lower second contact electrode 128 through the contact hole 114.

The second electrode 126 may be formed of a metal such as Al, Mo, Cu, or Ag, or an alloy such as MoTi.

The first electrode 116, the organic light emitting layer 130 and the second electrode 126 of the lighting portion constitute an organic light emitting diode.

In this instance, since the first passivation layer 115a is disposed on the auxiliary electrode 111 of the lighting portion, the organic light emitting layer 130 on the auxiliary electrode 111 is not directly brought into contact with the first electrode 116 and thus the organic light emitting diode is not formed on the auxiliary electrode 111. That is, the organic light emitting diode within the lighting portion is formed only in the light emitting area partitioned by the auxiliary electrode 111 formed in the matrix shape, for example (as shown in FIG. 5).

Figure 4E:
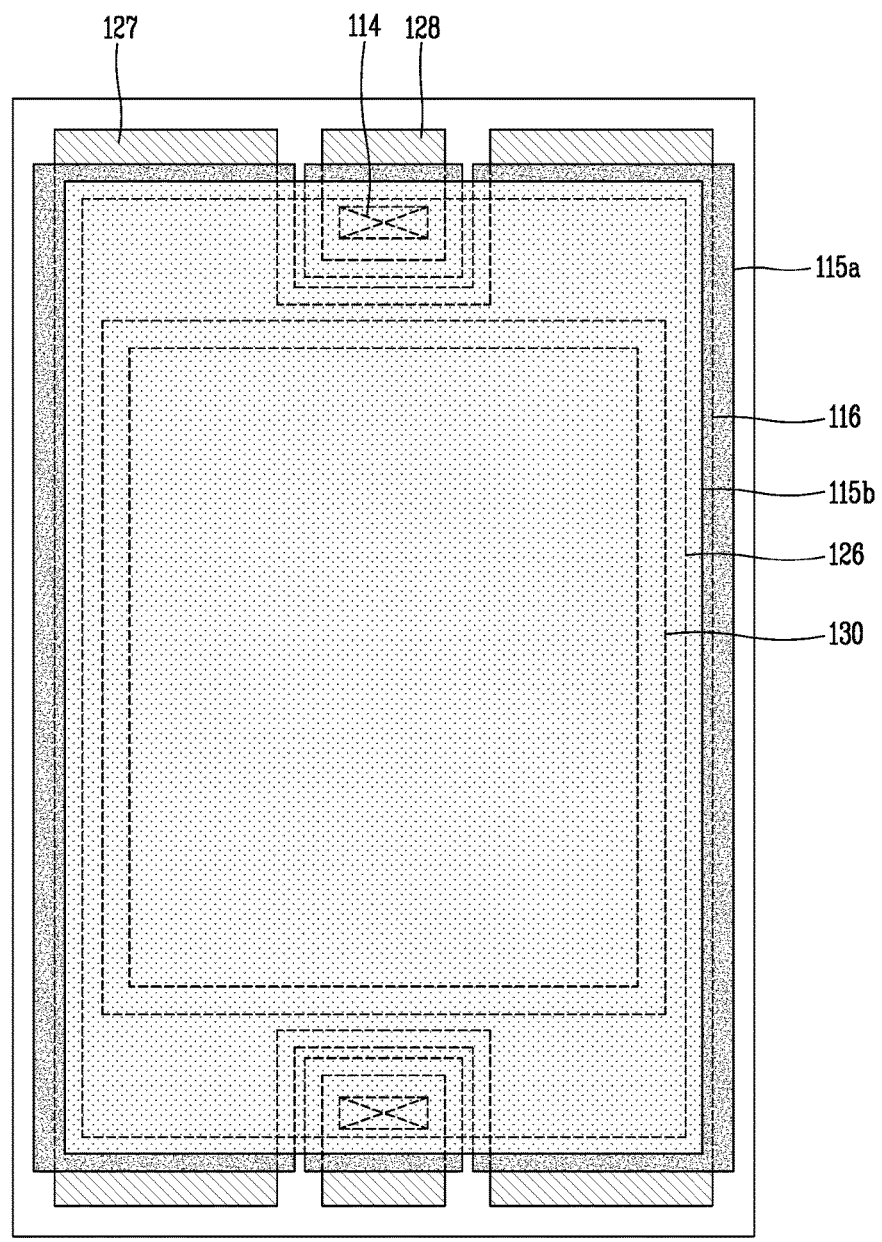
Figure 6E:
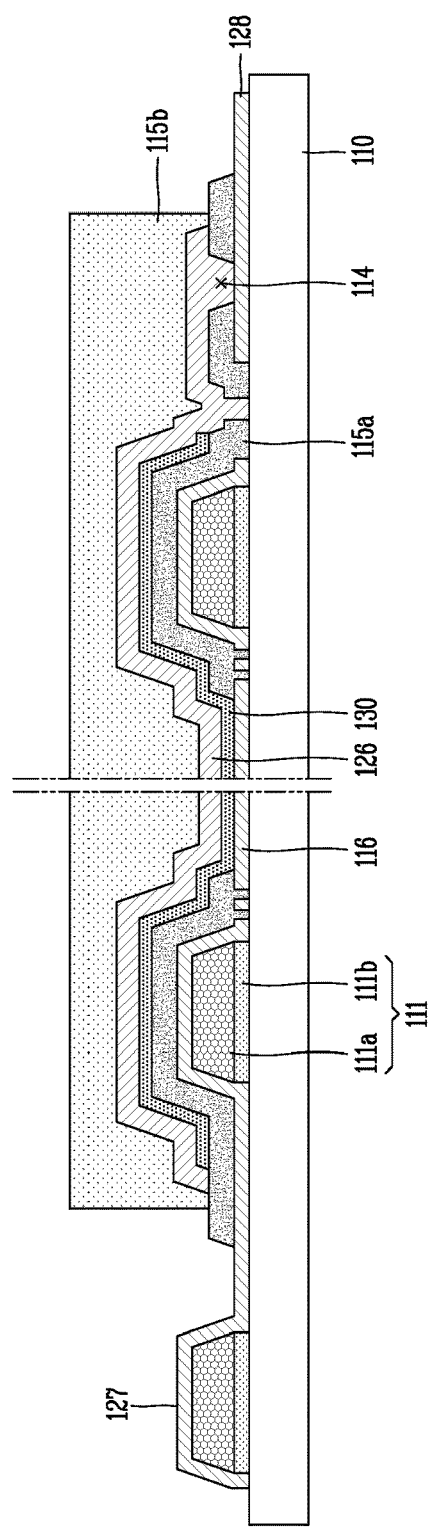

Next, referring to FIGS. 4E and 6E, the second passivation layer 115b made of the organic material is formed within the lighting portion of the substrate 110 in a manner of covering the organic light emitting layer 130 and the second electrode 126.

That is, the second passivation layer 115b, as aforementioned, is formed to cover the organic light emitting layer 130 and the second electrode 126 of the lighting portion. Accordingly, the second passivation layer 115b can prevent moisture introduction into the organic light emitting layer 130 of the lighting portion EA and simultaneously serve as an anti-scratch layer for preventing damages due to scratches or particles.

The second passivation layer 115b may be formed to have a thickness of about 5 to 10 μm in order to planarize the protruding portion of the auxiliary electrode 111.

At this time, the second passivation layer 115b may be made of an organic material such as photoacryl or a gas-permeable inorganic material.

The organic light emitting layer 130, the second electrode 126, and the second passivation layer 115b may be formed in an in-line manner by use of the roll-to-roll apparatus, and one related example is illustrated in FIG. 7.

Referring to FIG. 7, the roll-to-roll apparatus for fabricating a flexible lighting apparatus includes a film supply roll 152 for supplying a substrate 110 made of a plastic film, a film recovery roll 154 for recovering the substrate 110, and a plurality of guide rolls 153 and 156 for guiding the substrate 110.

Further, although not illustrated in detail, the roll-to-roll apparatus includes a mask supply roll for supplying an open mask (or a metal mask), a mask recovery roll for recovering the open mask, and a deposition device 180 for depositing an organic material or metal.

With this configuration, the substrate 110 which is used as the substrate of the lighting apparatus is transferred from the film supply roll 152 to the deposition device 180, 182 and simultaneously the open mask is transferred from the mask supply roll to the deposition device 180, 182. Accordingly, in a state where the open mask is arranged on an entire surface of the substrate 110, an organic material or a metal is deposited on a partial area of the substrate 110 through the deposition device 180, 182.

At this time, predetermined washing process, baking process, and de-gassing process may be performed before the deposition of the organic material or the metal. These washing process, baking process, and de-gassing process may be performed through another roll-to-roll apparatus.

Afterwards, the completely pre-processed substrate 110 is transferred to a roll-to-roll apparatus for deposition. At this time, plasma processing may be performed with respect to the surface of the substrate 110 through a predetermined plasma device 181.

The completely-deposited open mask is separated from the substrate 110. The substrate 110 is recovered by the film recovery roll 154, and the open mask is recovered by the mask recovery roll.

When using the roll-to-roll apparatus having the structure, the film 110 may be continuously supplied by the film supply roll 152, which allows the process to be continuously performed, thereby enabling a fast fabrication of the lighting apparatus.

Next, referring to FIG. 8, p-aging is performed to prevent a defective organic light emitting diode which is constituted by the organic light emitting layer and the electrode. In this instance, another roll-to-roll apparatus for the p-aging may include a film supply roll 152' for supplying the substrate 110, a film recovery roll 154' for recovering the substrate 110, and a plurality of guide rolls 156' for guiding the substrate 110.

This is to prevent a defect by oxidizing the electrode in a manner of applying an aging voltage to the organic light emitting diode. This p-aging is performed at the atmospheric pressure, i.e., in the air atmosphere, to oxidize the electrode. Thus, the substrate 110 is wound and unwound to move to a p-aging chamber. At this time, since the surface of the organic light emitting diode is covered and protected by the second passivation layer according to the present disclosure, a defect due to scratches or particles can be prevented even while winding or unwinding the substrate 110. Therefore, a yield is improved, which results in reducing a fabricating cost and enhancing reliability.

Figure 4F:
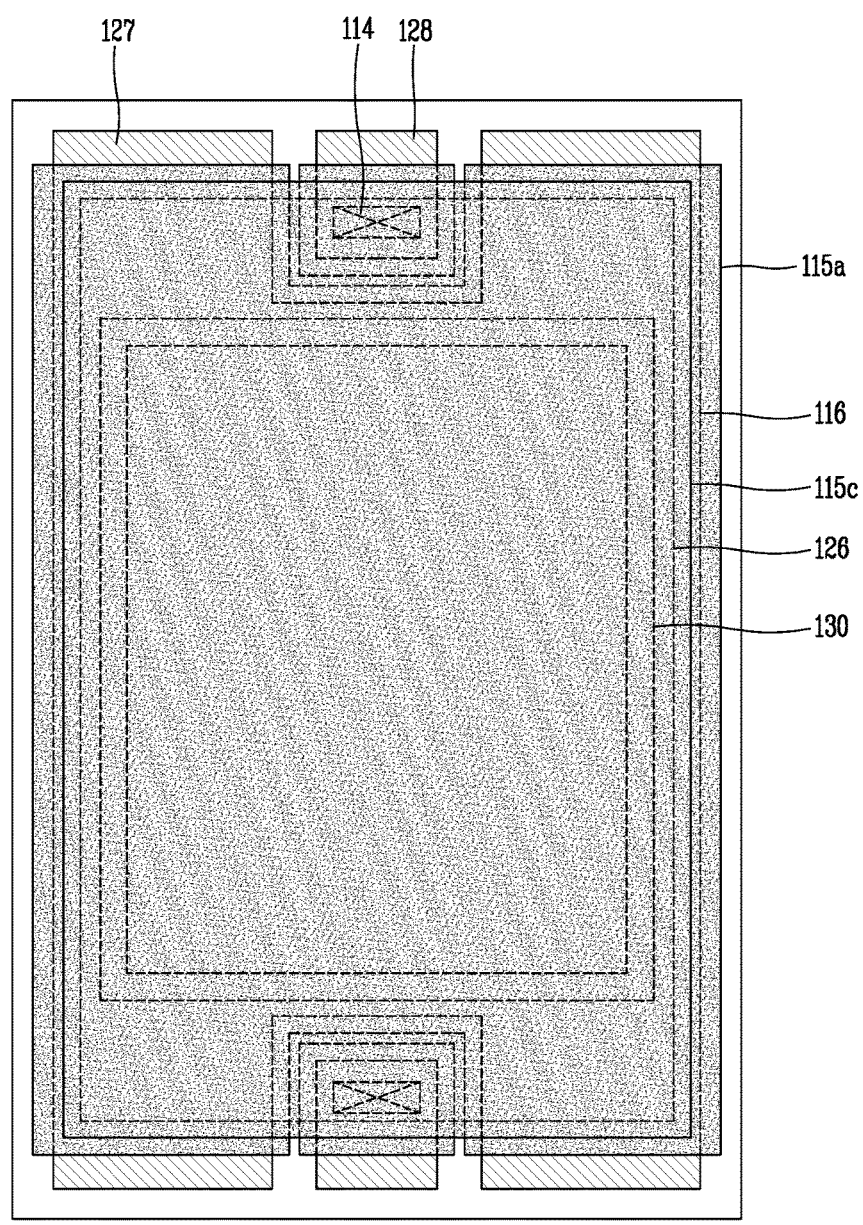
Figure 6F:
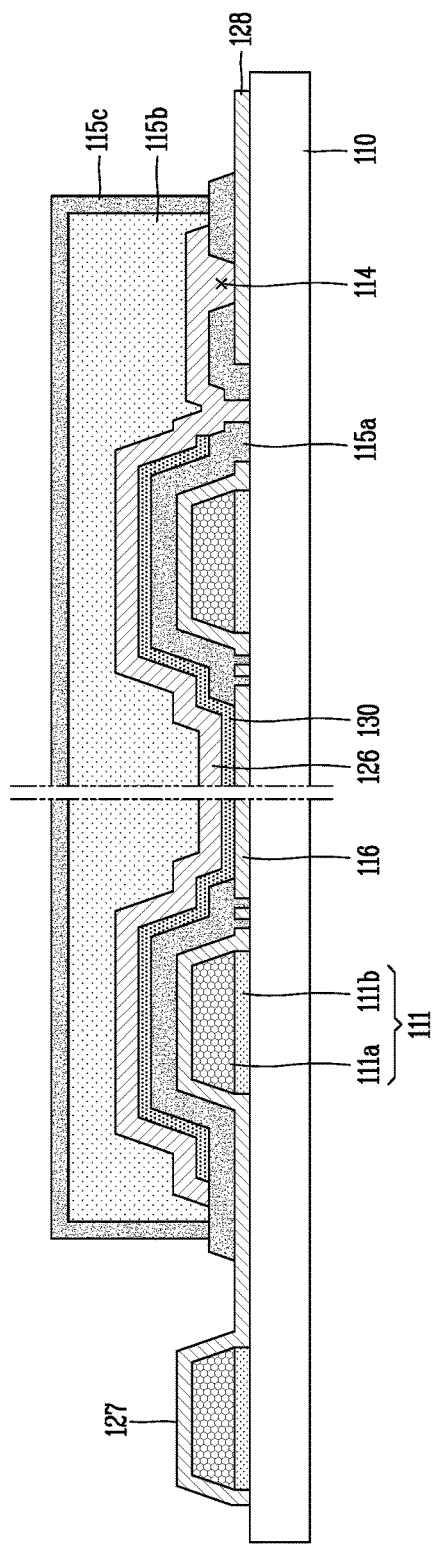

Next, referring to FIGS. 4F and 6F, the third passivation layer 115c is formed within the lighting portion of the substrate 110 in a manner of covering the second passivation layer 115b.

The third passivation layer 115c may be formed by another roll-to-roll apparatus. Referring to FIG. 9, the another roll-to-roll apparatus for forming the third passivation layer 115c may include a film supply roll 152" for supplying the substrate 110, a film recovery roll 152" for recovering the substrate 110, and a guide roll 157 for guiding the substrate 110. The roll-to-roll apparatus may further include a deposition device 183 for spraying an inorganic material on the surface of the substrate 110 to form the third passivation layer 115c.

The third passivation layer 115c may be made of an inorganic material such as $SiO_x$ or $SiN_x$. However, the present disclosure is not limited thereto.

A predetermined encapsulant may be additionally provided on the third passivation layer 115c. The encapsulant may be an epoxy compound, an acrylate compound, an acrylic compound, or the like.

Figure 4G:
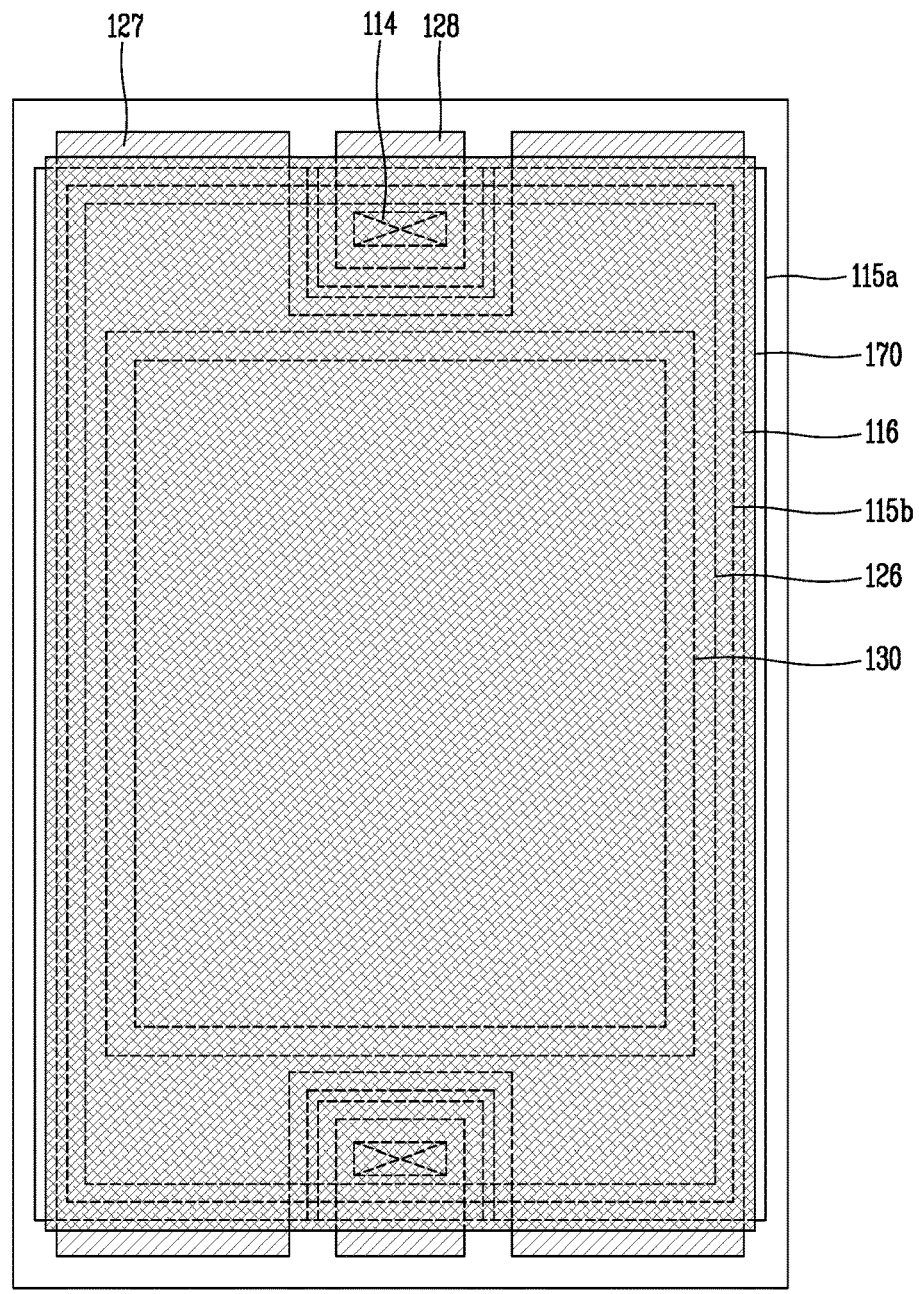
Figure 6G:
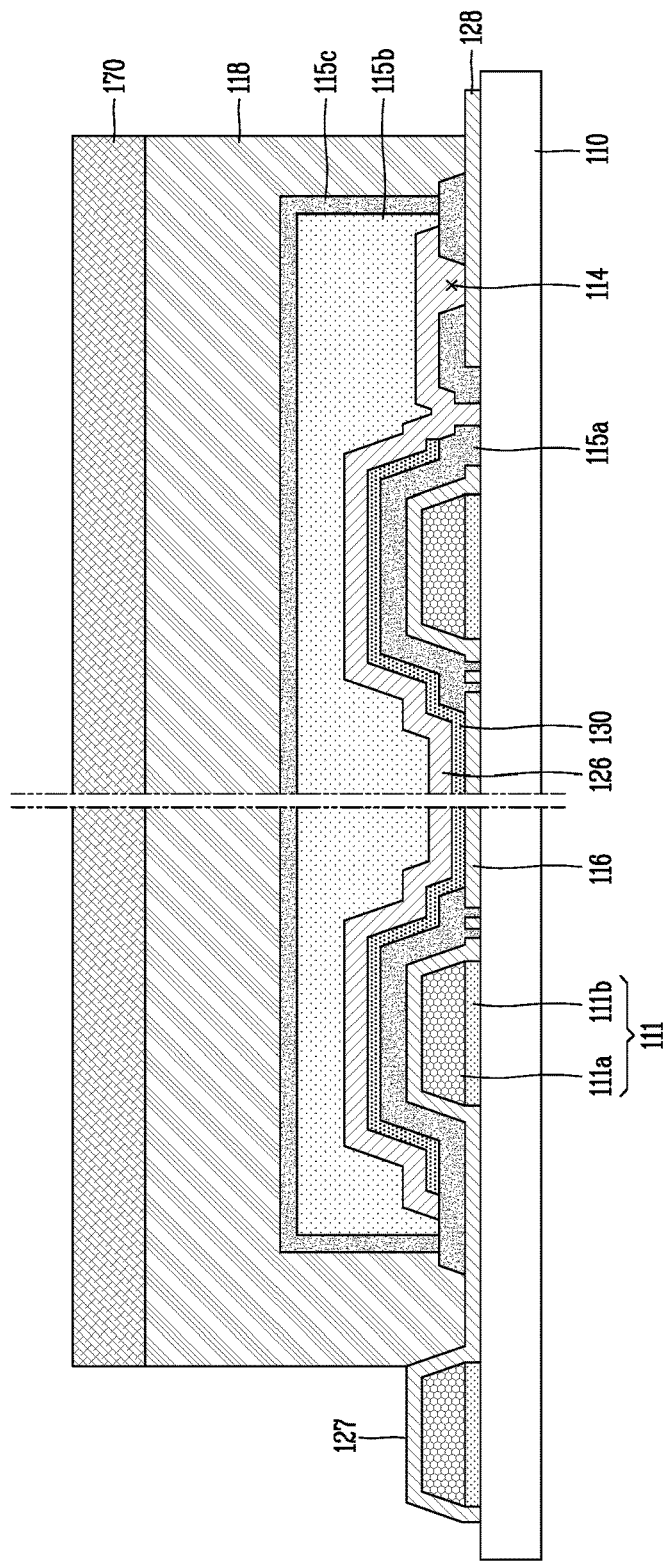

Next, referring to FIGS. 4G and 6G, the adhesive 118 made of the photocurable adhesive material or the thermosetting adhesive material is applied on the lighting portion of the substrate 110. Then, the metal film 170 is placed on the adhesive 118 and the adhesive 118 is cured to attach the metal film 170, thereby completing fabrication of the lighting apparatus.

At this time, the first and second contact portions may not be obscured by the encapsulating member of the metal film 170, so as to be electrically connected to the outside through the first and second contact electrodes 127 and 128.

In this case, as described above, the aspect of the present disclosure illustrates the example in which the second passivation layer 115b fills the periphery of the second electrode 126, but the present disclosure is not limited thereto. The second passivation layer 115b is formed at least up to the height of the second electrode 126. Hereinafter, the case where the second passivation layer 115b is formed up to the height of the second electrode 126 will be described in detail based on another aspect of the present disclosure.

Figure 10:
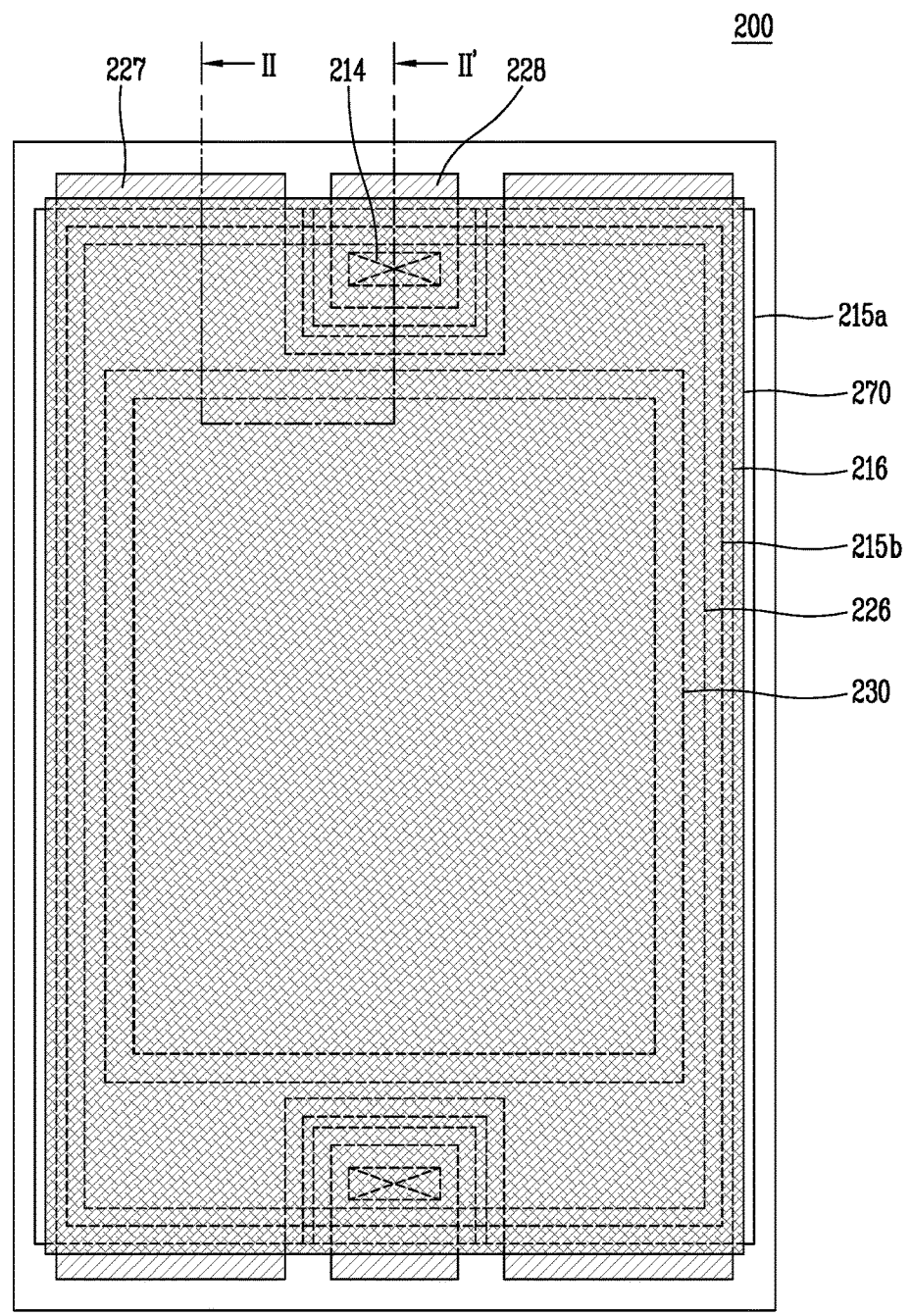
FIG. 10 is a planar view schematically illustrating a lighting apparatus using an organic light emitting diode in accordance with another aspect of the present disclosure.

FIG. 10 is a planar view schematically illustrating a lighting apparatus using an organic light emitting diode according to another aspect of the present disclosure.

Figure 11:
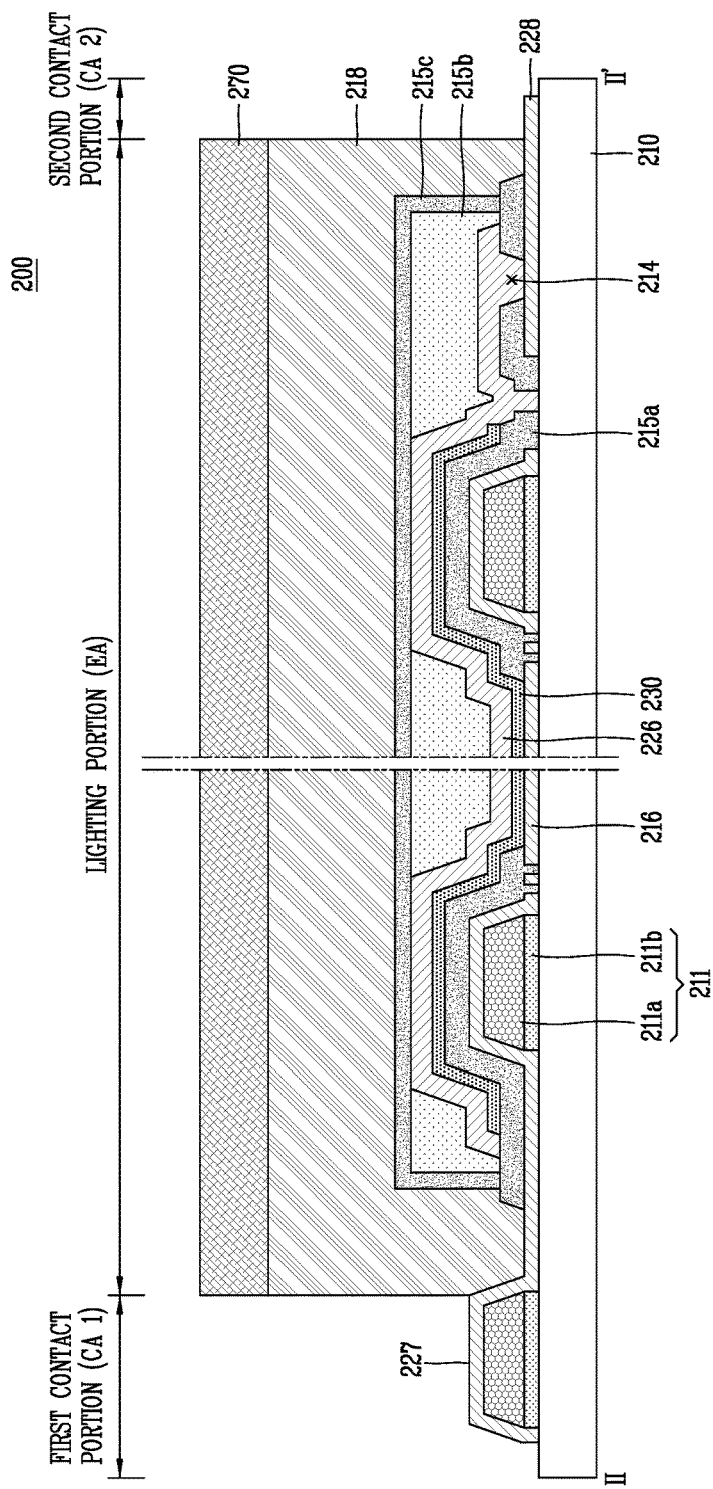
FIG. 11 is a view schematically illustrating a cross-section of the lighting apparatus using the organic light emitting diode according to the another aspect illustrated in FIG. 10, taken along line II-II' of FIG. 10.

FIG. 11 is a schematic sectional view of the lighting apparatus using the organic light emitting diode according to another aspect of the present disclosure, taken along line II-IT of FIG. 10.

In this case, the lighting apparatus using the organic light emitting diode according to another aspect of the present disclosure illustrated in FIGS. 10 and 11 is substantially the same as the lighting apparatus according to the foregoing aspect, except for that the second passivation layer is formed up to the height of the second electrode.

That is, the lighting apparatus using the organic light emitting diode according to the another aspect of the present disclosure may include an organic light emitting diode part performing a surface emission, and an encapsulating part for encapsulating the organic light emitting diode part.

In this instance, the organic light emitting diode part is implemented as an organic light emitting diode provided on the substrate. As illustrated in FIGS. 10 and 11, a substrate 210 may include a lighting portion EA for actually emitting light to the outside, and contact portions CA1 and CA2 electrically connected to the outside through the contact electrodes 227 and 228 to apply a signal to the lighting portion EA.

The contact portions CA1 and CA2 are not covered by the encapsulating member of the metal film 270 and thus can be electrically connected to the outside through the contact electrodes 227 and 228. Therefore, the metal film 270 can be attached to the entire surface of the lighting portion EA of the substrate 210 except for the contact portions CA1 and CA2.

At this time, the contact portions CA1 and CA2 may be located outside the lighting portion EA. FIG. 10 illustrates an example in which the second contact portion CA2 is located between the first contact portions CA1, but the present disclosure is not limited thereto.

Also, FIG. 10 illustrates that the contact portions CA1 and CA2 are all located at upper and lower sides of the lighting portion EA outside the lighting portion EA, but the present disclosure is not limited thereto. Therefore, the contact portions CA1 and CA2 of the present disclosure may be located at the outside of only one of the upper and lower sides of the lighting portion EA.

A first electrode 216 and a second electrode 226 are disposed on the substrate 210 and an organic light emitting layer 230 is disposed between the first electrode 216 and the second electrode 226, thereby forming an organic light emitting diode.

At this time, a first passivation layer 215a, the organic light emitting layer 230 and the second electrode 226 are not formed on the contact portions CA1 and CA2 outside the lighting portion EA, and thus contact electrodes 227 and 228 may be exposed to the outside. In this instance, the second passivation layer 215b as an anti-scratch layer and a third passivation layer 215c as an encapsulating layer are formed to cover the organic light emitting layer 230 and the second electrode 226 of the lighting portion EA, thereby preventing moisture introduction into the organic light emitting layer 230 of the lighting portion EA.

Since the second passivation layer 215b planarizes a protruding portion of an auxiliary electrode 211, pressure applied to the substrate 210 may be uniformly maintained even when winding or unwinding the substrate 210 for p-aging, thereby preventing damages due to scratches or particles. Therefore, yield is improved, which results in reducing a fabricating cost and simultaneously ensuring reliability.

At this time, the second passivation layer 215b may be made of an organic material or a gas-permeable inorganic material, and may have a thickness of about 5 to 10 μm through a deposition or a coating process such as flash deposition or the like.

In addition, the second passivation layer 215b according to another aspect of the present disclosure is formed up to a height of the lower second electrode 226. In this case, the second passivation layer 216b may serve as the anti-scratch layer and simultaneously minimize the overall thickness of the illumination device 200. This may allow a reduction of the fabricating cost and a flexible bending.

The second passivation layer 215c may be made of an inorganic material.

At this time, the first electrode 216 including the first contact electrode 227 and the second contact electrode 228 are disposed on the substrate 210 made of a transparent material. A rigid material such as glass may be used as the substrate 210. However, the substrate 200 may be made of a material having flexibility such as plastic which may allow a fabrication of the lighting apparatus 200 which is bendable or curvable. Further, in the present disclosure, by forming the substrate 210 using the plastic material having the flexibility, a process using a roll may be enabled, which may result in allowing a fast fabrication of the lighting apparatus 100.

The first electrode 216 including the first contact electrode 217 and the second contact electrode 228 are formed on the lighting portion EA and the first and second contact portions CA1 and CA2, and may be made of a transparent conductive material having high conductivity and work function.

The first electrode 216 may extend to the first contact portion CA1 outside the lighting portion EA to become the first contact electrode 227, and the second contact electrode 228 electrically insulated from the first electrode 216 may be disposed on a part of the lighting portion EA and the second contact portion CA2. In other words, the second contact electrode 228 may be disposed within the same layer as the first electrode 216, with being electrically insulated from the first electrode 216.

For example, FIG. 10 illustrates that the first electrode 216 including the first contact electrode 227 is formed in a rectangular shape as a whole with upper and lower central portions recessed, and the second contact electrode 228 is disposed in each recess. However, the present disclosure is not limited thereto.

The auxiliary electrode 211 may be disposed on the lighting portion EA and the first contact portion CA1 of the substrate 210 to be electrically connected to the first electrode 216 and the first contact electrode 227.

The auxiliary electrode 211 is arranged in a form of a thin matrix, a mesh, a hexagon, an octagon, a circle, or the like throughout the entire lighting portion EA. This allows the current to be evenly applied to the first electrode 116 of the entire lighting portion EA, thereby enabling the lighting apparatus 100 to emit light with uniform luminance.

FIG. 11 illustrates that the auxiliary electrode 211 is disposed on a lower portion of the first electrode 216 including the first contact electrode 227. However, the present disclosure is not limited thereto, and the auxiliary electrode 211 may alternatively be disposed on an upper portion of the first electrode 216 including the first contact electrode 227. The auxiliary electrode 211 disposed on the first contact portion CA1 may be used as a path for transferring current toward the first electrode 216 through the first contact electrode 227. However, the auxiliary electrode 211 may also serve as a contact electrode which is brought into contact with an outside to apply external current to the first electrode 216.

The auxiliary electrode 211 may be made of a metal having good conductivity such as Al, Au, Cu, Ti, W, Mo, or an alloy thereof. The auxiliary electrode 211 may have a two-layered structure including an upper auxiliary electrode 211a and a lower auxiliary electrode 211b. However, the present disclosure is not limited thereto and the auxiliary electrode 111 may be configured as a single layer.

The first passivation layer 215a may be laminated on the lighting portion EA of the substrate 210. FIG. 10 illustrates that the first passivation layer 215a is shown having a shape of a rectangular frame with a predetermined width, but the present disclosure is not limited thereto.

The first passivation layer 215a disposed on the lighting portion EA is configured to cover the auxiliary electrode 211 and the first electrode 216 on the auxiliary electrode 211, but is not disposed on the light emitting area where light is actually emitted. In particular, the first passivation layer 215a of the lighting portion EA may be formed to surround the auxiliary electrode 211 to reduce a stepped portion by the auxiliary electrode 211. Accordingly, various layers to be formed later can be formed stably without being disconnected.

The first passivation layer 215a may be made of an inorganic material such as $SiO_x$ or $SiN_x$. However, the first passivation layer 215a may alternatively be made of an organic material such as photoacryl, or be formed by a plurality of layers of an inorganic material and an organic material.

The organic light emitting layer 230 and the second electrode 226 may be disposed on the substrate 210 on which the first electrode 216 and the first passivation layer 215a are disposed. At this time, the first passivation layer 215a on the second contact electrode 228 located in the lighting portion EA may have a predetermined area, which is removed to form a contact hole 214 for exposing the second contact electrode 228. Accordingly, the second electrode 226 may be electrically connected to the lower second contact electrode 228 through the contact hole 214.

As described above, the organic light emitting layer 230 which is a white organic light emitting layer, may be provided with a red light emitting layer, a blue light emitting layer, and a green light emitting layer, or may be configured in a tandem structure including a blue light emitting layer and a yellow-green light emitting layer. The organic light emitting layer 230 may include an electron injection layer and a hole injection layer for injecting electrons and holes respectively into the light emitting layer, an electron transport layer and a hole transport layer for transporting the injected electrons and holes to the light emitting layer, and a charge generating layer for generating charges such as the electrons and holes.

The second electrode 226 may be made of a metal such as Al, Mo, Cu and Ag, or an alloy such as MoTi.

The substrate 210 with the second electrode 226 may be provided with the second passivation layer 215b and the third passivation layer 215c.

At this time, the second passivation layer 215b according to another aspect, as aforementioned, is formed to cover the organic light emitting layer 230 and the second electrode 226 of the lighting portion EA, and may be formed up to the height of the second electrode 226.

The second passivation layer 215b may be made of an organic material such as photoacryl or a gas-permeable inorganic material. In addition, the third passivation layer 215c may be made of an inorganic material such as $SiO_x$ or $SiN_x$. However, the present disclosure is not limited thereto.

A predetermined encapsulant may further be provided on the third passivation layer 215c. The encapsulant may be made of an epoxy compound, an acrylate compound, an acrylic compound, or the like.

As described above, the first contact electrode 227 extending from the first electrode 216 is exposed to the outside on the substrate 210 of the first contact portion CA1. The second contact electrode 228 electrically connected to the second electrode 226 through the contact hole 214 is exposed to the outside on the substrate 210 of the second contact portion CA2. Accordingly, the first contact electrode 227 and the second contact electrode 228 are electrically connected to an external power source to apply currents to the first electrode 216 and the second electrode 226, respectively.

The adhesive 218 such as pressure sensitive adhesive (PSA) is coated on the third passivation layer 215c and the metal film 270 is disposed on the adhesive 218. The metal film 270 is then attached to the third passivation layer 215c, thereby encapsulating the lighting apparatus 200.

At this time, the adhesive 218 and the encapsulating means of the metal film 270 are formed to sufficiently cover the second passivation layer 215b and the third passivation layer 215c.

Although many details have been described above, it should be construed that they are merely illustrative for the preferred aspects rather than limiting the scope of the disclosure. Therefore, the disclosure should not be construed as limited to the aspects described, but should be determined by the appended claims and equivalents to the claims.

What is claimed is:

1. A lighting apparatus using an organic light emitting diode, the apparatus comprising:
    a substrate having a lighting portion and first and second contact portions;
    a first electrode on the substrate;
    a first passivation layer on the first electrode;
    an organic light emitting layer and a second electrode at the lighting portion and covering the first passivation layer;
    a second passivation layer covering both the organic light emitting layer and the second electrode and planarizing the substrate of the lighting portion;
    a third passivation layer surrounding the second passivation layer including on the first passivation layer; and
    a metal film at the lighting portion and covering the second passivation layer.

2. The apparatus of claim 1, wherein the first and second contact portions are located outside the lighting portion in a manner that the first contact portion is located at least one of left and right sides of the lighting portion.

3. The apparatus of claim 2, wherein the first electrode is extended to the first contact portion to become a first contact electrode.

4. The apparatus of claim 2, further comprising a second contact electrode at both the lighting portion and the second contact portion and made of the same conductive material as the first electrode.

5. The apparatus of claim 4, wherein the first passivation layer has a contact hole for exposing a portion of the second contact electrode at the lighting portion.

6. The apparatus of claim 5, wherein the second electrode is electrically connected to the second contact electrode through the contact hole.

7. The apparatus of claim 1, wherein the second passivation layer is formed to have a height at least up to a height of the second electrode so as to fill a periphery of the second electrode for planarizing the second electrode.

8. The apparatus of claim 1, wherein the second passivation layer is made of an organic material of photoacryl or a gas-permeable inorganic material.

9. The apparatus of claim 1, wherein the third passivation layer is made of an inorganic material covering the second passivation layer.

10. The apparatus of claim 4, wherein the first electrode including the first contact electrode has a rectangular shape with a recess at a central portion of at least one of upper and lower portions thereof, and the second contact electrode is disposed within the recess.

11. A lighting apparatus using an organic light emitting diode, the apparatus comprising:
    a substrate having a lighting portion and first and second contact portions;
    an auxiliary electrode at the lighting portion on the substrate and serving as an additional contact electrode;
    a first electrode on the substrate including the auxiliary electrode;
    a passivation layer on the substrate including the first electrode;
    an organic emissive layer, a second electrode, and an anti-scratching layer on the entire surface of the substrate including the passivation layer; and
    an encapsulating layer surrounding the anti-scratching layer including on the passivation layer.

12. The apparatus of claim 11, wherein the first and second contact portions are located outside the lighting portion.

13. The apparatus of claim 11, wherein the first electrode is extended to the first contact portion and become a first contact electrode.

14. The apparatus of claim 11, further comprising a second contact electrode at both the lighting portion and the second contact portion and made of the same conductive material as the first electrode.

15. The apparatus of claim 14, wherein the passivation layer has a contact hole for exposing a portion of the second contact electrode at the lighting portion.

16. The apparatus of claim 15, wherein the second electrode is electrically connected to the second contact electrode through the contact hole.

17. The apparatus of claim 11, wherein the second passivation layer is formed to have a height at least up to a height of the second electrode so as to planarize a surface of the second electrode.

18. The apparatus of claim 11, wherein the anti-scratching layer is made of an organic material of photoacryl or a gas-permeable inorganic material.

19. The apparatus of claim 11, further comprising a metal film over the anti-scratching layer.

20. The apparatus of claim 11, further comprising an adhesive layer attached the metal film to the anti-scratching layer.

* * * * *